United States Patent
Yamazaki et al.

(10) Patent No.: US 10,043,424 B2
(45) Date of Patent: Aug. 7, 2018

(54) METHOD FOR MANUFACTURING A DISPLAY DEVICE HAVING AN OXIDE SEMICONDUCTOR SWITCHING TRANSISTOR

(71) Applicant: Semiconductor Energy Laboratory Co., Ltd., Atsugi-shi, Kanagawa-ken (JP)

(72) Inventors: Shunpei Yamazaki, Tokyo (JP); Jun Koyama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 9 days.

(21) Appl. No.: 15/259,360

(22) Filed: Sep. 8, 2016

(65) Prior Publication Data

US 2016/0379534 A1    Dec. 29, 2016

Related U.S. Application Data

(63) Continuation of application No. 13/072,864, filed on Mar. 28, 2011, now Pat. No. 9,646,521.

(30) Foreign Application Priority Data

Mar. 31, 2010    (JP) ................................ 2010-080794

(51) Int. Cl.
*H01L 29/786* (2006.01)
*G02F 1/1368* (2006.01)
(Continued)

(52) U.S. Cl.
CPC ........... *G09G 3/003* (2013.01); *G02F 1/1368* (2013.01); *G09G 3/2003* (2013.01);
(Continued)

(58) Field of Classification Search
CPC ............... H01L 29/7869; H01L 29/786; H01L 29/78696; G02F 1/1368; G02F 1/136277
See application file for complete search history.

(56) References Cited

U.S. PATENT DOCUMENTS

| 5,731,856 | A | 3/1998 | Kim et al. |
| 5,744,864 | A | 4/1998 | Cillessen et al. |

(Continued)

FOREIGN PATENT DOCUMENTS

| CN | 101604081 A | 12/2009 |
| EP | 1489858 A | 12/2004 |

(Continued)

OTHER PUBLICATIONS

International Search Report (Application No. PCT/JP2011/055716) dated Jun. 14, 2011.

(Continued)

*Primary Examiner* — Andrew Q Tran
(74) *Attorney, Agent, or Firm* — Fish & Richardson P.C.

(57) ABSTRACT

It is an object to provide a specific driving method for reduction in power consumption in displaying a 3D image with field sequential driving. A driving method of a liquid crystal display device is a method in which a stereoscopic image can be perceived with a liquid crystal display device switching an image for a left eye and an image for a right eye to display the image for the left eye or the image for the right eye, and a pair of glasses having a switching circuitry with which the image for the right eye and the image for the left eye are switched in synchronization with display of the image for the left eye or the image for the right eye in order that the left or right eye of a viewer may selectively perceive the image for the left eye or the image for the right eye; the image for the left eye and the image for the right eye are perceived by the left eye or right eye in a mixed color by switching light which is emitted from a backlight portion (Continued)

and which corresponds to a plurality of colors, within a predetermined period, and the light which is emitted from the backlight portion are continuously emitted in accordance with an image signal of each of a plurality of colors which forms the linage for the left eye and the image for the right eye.

6 Claims, 16 Drawing Sheets

(51) Int. Cl.

| | | |
|---|---|---|
| G09G 3/00 | (2006.01) | |
| G09G 3/34 | (2006.01) | |
| H04N 13/04 | (2006.01) | |
| H01L 27/12 | (2006.01) | |
| G09G 3/20 | (2006.01) | |
| G09G 3/36 | (2006.01) | |
| H01L 21/477 | (2006.01) | |
| G02F 1/1337 | (2006.01) | |
| G02F 1/1343 | (2006.01) | |
| G02F 1/1362 | (2006.01) | |
| G02F 1/1333 | (2006.01) | |

(52) U.S. Cl.
CPC ......... *G09G 3/3406* (2013.01); *G09G 3/3413* (2013.01); *G09G 3/3677* (2013.01); *H01L 21/477* (2013.01); *H01L 27/127* (2013.01); *H01L 27/1225* (2013.01); *H01L 29/7869* (2013.01); *H01L 29/78696* (2013.01); *H04N 13/044* (2013.01); *H04N 13/0422* (2013.01); *H04N 13/0438* (2013.01); *H04N 13/0497* (2013.01); *G02F 1/13378* (2013.01); *G02F 1/134363* (2013.01); *G02F 1/136286* (2013.01); *G02F 2001/133302* (2013.01); *G02F 2201/123* (2013.01); *G09G 2300/0426* (2013.01); *G09G 2310/0235* (2013.01); *G09G 2310/0237* (2013.01); *G09G 2310/08* (2013.01); *G09G 2320/0646* (2013.01); *G09G 2330/021* (2013.01)

(56) References Cited

U.S. PATENT DOCUMENTS

| | | | |
|---|---|---|---|
| 5,903,243 A | 5/1999 | Jones | |
| 6,294,274 B1 | 9/2001 | Kawazoe et al. | |
| 6,314,248 B1 | 11/2001 | Ohmura et al. | |
| 6,563,174 B2 | 5/2003 | Kawasaki et al. | |
| 6,597,348 B1 | 7/2003 | Yamazaki et al. | |
| 6,727,522 B1 | 4/2004 | Kawasaki et al. | |
| 7,023,466 B2 | 4/2006 | Favalora et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,066,599 B2 | 6/2006 | Hattori et al. | |
| 7,105,868 B2 | 9/2006 | Nause et al. | |
| 7,189,992 B2 | 3/2007 | Wager, III et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,317,438 B2 | 1/2008 | Yamazaki et al. | |
| 7,323,356 B2 | 1/2008 | Hosono et al. | |
| 7,339,187 B2 | 3/2008 | Wager, III et al. | |
| 7,345,661 B2 | 3/2008 | Miyagawa et al. | |
| 7,385,224 B2 | 6/2008 | Ishii et al. | |
| 7,385,579 B2 | 6/2008 | Satake | |
| 7,385,625 B2 | 6/2008 | Ohmura et al. | |
| 7,402,506 B2 | 7/2008 | Levy et al. | |
| 7,403,177 B2 | 7/2008 | Tanada et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,724,211 B2 | 5/2010 | Slavenburg et al. | |
| 7,732,819 B2 | 6/2010 | Akimoto et al. | |
| 7,800,578 B2 | 9/2010 | Shih et al. | |
| 7,888,207 B2 | 2/2011 | Wager, III et al. | |
| 7,910,490 B2 | 3/2011 | Akimoto et al. | |
| 7,932,521 B2 | 4/2011 | Akimoto et al. | |
| 8,044,881 B2 | 10/2011 | Nam et al. | |
| 8,169,467 B2 | 5/2012 | Slavenburg et al. | |
| 8,232,552 B2 | 7/2012 | Yano et al. | |
| 8,274,077 B2 | 9/2012 | Akimoto et al. | |
| 8,274,448 B1 | 9/2012 | Cook | |
| 8,289,228 B2 | 10/2012 | Arai | |
| 8,314,637 B2 * | 11/2012 | Kato | G11C 14/0063 326/102 |
| 8,343,817 B2 | 1/2013 | Miyairi et al. | |
| 8,350,780 B1 | 1/2013 | Cook | |
| 8,388,138 B1 | 3/2013 | Boothroyd | |
| 8,395,938 B2 * | 3/2013 | Yamazaki | G11C 11/404 365/185.05 |
| 8,445,903 B2 | 5/2013 | Inoue et al. | |
| 8,466,463 B2 | 6/2013 | Akimoto et al. | |
| 8,576,208 B2 | 11/2013 | Slavenburg et al. | |
| 8,581,833 B2 | 11/2013 | Slavenburg et al. | |
| 8,605,071 B2 | 12/2013 | Chen et al. | |
| 8,629,069 B2 | 1/2014 | Akimoto et al. | |
| 8,669,550 B2 | 3/2014 | Akimoto et al. | |
| 8,729,547 B2 | 5/2014 | Miyairi et al. | |
| 8,785,240 B2 | 7/2014 | Watanabe | |
| 8,790,959 B2 | 7/2014 | Akimoto et al. | |
| 8,796,069 B2 | 8/2014 | Akimoto et al. | |
| 8,872,754 B2 | 10/2014 | Slavenburg et al. | |
| 8,878,904 B2 | 11/2014 | Slavenburg et al. | |
| 8,907,885 B2 | 12/2014 | Chen et al. | |
| 8,946,703 B2 | 2/2015 | Miyairi et al. | |
| 8,962,457 B2 | 2/2015 | Watanabe | |
| 9,099,562 B2 | 8/2015 | Akimoto et al. | |
| 9,142,179 B2 | 9/2015 | Kimura et al. | |
| 9,166,058 B2 | 10/2015 | Miyairi et al. | |
| 9,236,456 B2 | 1/2016 | Miyairi et al. | |
| 9,437,748 B2 | 9/2016 | Miyairi et al. | |
| 9,646,521 B2 * | 5/2017 | Yamazaki | G09G 3/003 |
| 2001/0046027 A1 | 11/2001 | Tai et al. | |
| 2002/0001472 A1 | 1/2002 | Ohmura et al. | |
| 2002/0056838 A1 | 5/2002 | Ogawa | |
| 2002/0060662 A1 | 5/2002 | Hong | |
| 2002/0132454 A1 | 9/2002 | Ohtsu et al. | |
| 2002/0175632 A1 | 11/2002 | Takeguchi | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0114317 A1 | 6/2006 | Yuuki et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |

(56) References Cited

U.S. PATENT DOCUMENTS

| | | |
|---|---|---|
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0108198 A1 | 5/2008 | Wager, III et al. |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0280071 A1 | 11/2008 | Kikuchi et al. |
| 2008/0296568 A1 | 12/2008 | Ryu et al. |
| 2008/0308805 A1 | 12/2008 | Akimoto et al. |
| 2009/0040411 A1 | 2/2009 | Kawamura et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0115783 A1 | 5/2009 | Eichenlaub |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0303219 A1 | 12/2009 | Kimura et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0225750 A1 | 9/2010 | Nakahata et al. |
| 2010/0289969 A1 | 11/2010 | Yamazaki et al. |
| 2011/0104851 A1 | 5/2011 | Akimoto et al. |
| 2011/0121290 A1 | 5/2011 | Akimoto et al. |
| 2011/0205335 A1 | 8/2011 | Kim et al. |
| 2013/0234134 A1 | 9/2013 | Inoue et al. |
| 2015/0340513 A1 | 11/2015 | Akimoto et al. |
| 2016/0005373 A1 | 1/2016 | Kimura et al. |

FOREIGN PATENT DOCUMENTS

| | | |
|---|---|---|
| EP | 1737044 A | 12/2006 |
| EP | 1770788 A | 4/2007 |
| EP | 1983764 A | 10/2008 |
| EP | 1995787 A | 11/2008 |
| EP | 1998373 A | 12/2008 |
| EP | 1998374 A | 12/2008 |
| EP | 1998375 A | 12/2008 |
| EP | 2136354 A | 12/2009 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 11-331879 A | 11/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-066920 A | 3/2003 |
| JP | 2003-086000 A | 3/2003 |
| JP | 2003-086808 A | 3/2003 |
| JP | 2003-259395 A | 9/2003 |
| JP | 2004-103957 A | 4/2004 |
| JP | 2004-273614 A | 9/2004 |
| JP | 2004-273732 A | 9/2004 |
| JP | 2006-005116 A | 1/2006 |
| JP | 2006-502597 | 1/2006 |
| JP | 2007-123861 A | 5/2007 |
| JP | 2008-243928 A | 10/2008 |
| JP | 2008-268396 A | 11/2008 |
| JP | 2008-281988 A | 11/2008 |
| JP | 2008-283046 A | 11/2008 |
| JP | 2009-230071 A | 10/2009 |
| JP | 2010-020292 A | 1/2010 |
| JP | 2010-062549 A | 3/2010 |
| KR | 2009-0127814 A | 12/2009 |
| TW | 200506431 | 2/2005 |
| TW | 200819788 | 5/2008 |
| TW | 200826022 | 6/2008 |
| TW | 200912468 | 3/2009 |
| TW | 200951593 | 12/2009 |
| TW | 201028993 | 8/2010 |
| WO | WO-2004/038757 | 5/2004 |
| WO | WO-2004/114391 | 12/2004 |
| WO | WO-2007/126904 | 11/2007 |
| WO | WO-2008/126879 | 10/2008 |
| WO | WO-2008/143021 | 11/2008 |
| WO | WO-2009/034953 | 3/2009 |
| WO | WO-2010/047077 | 4/2010 |

OTHER PUBLICATIONS

Written Opinion (Application No. PCT/JP2011/055716) dated Jun. 14, 2011.

Coates.D et al., "Optical Studies of the Amorphous Liquid-Cholesteric Liquid Crystal Transition: The "Blue Phase"", Physics Letters, Sep. 10, 1973, vol. 45A, No. 2, pp. 115-116.

Meiboom.S et al., "Theory of The Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YbFe2O4, and Yb2Fe3O7 Types of Structures for Compounds in the In2O3 and Sc2O3—A2O3—Bo Systems [A; Fe, Ga, Or Al; B: Mg, Mn, Fe, Ni, Cu,Or Zn] at Temperatures Over 1000° C", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

(56) References Cited

OTHER PUBLICATIONS

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MoO3 As a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Park.S et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "Suftla Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters) , 2005, vol. 87, pp. 122102-1-122102-3.

Clark.S et al., "First Principles Methods Using CASTEP", Zeitschrift fur Kristallographie, 2005, vol. 220, pp. 567-570.

(56) References Cited

OTHER PUBLICATIONS

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Taiwanese Office Action (Application No. 100109568) dated Jan. 12, 2016.

Taiwanese Office Action (Application No. 100109568) dated Apr. 6, 2016.

* cited by examiner

METHOD FOR MANUFACTURING A DISPLAY DEVICE HAVING AN OXIDE SEMICONDUCTOR SWITCHING TRANSISTOR

CROSS-REFERENCE TO RELATED APPLICATIONS

This application is a continuation of U.S. application Ser. No. 13/072,864, filed Mar. 28, 2011, now allowed, which claims the benefit of a foreign priority application filed in Japan as Serial No. 2010-080794 on Mar. 31, 2010, both of which are incorporated by reference.

TECHNICAL FIELD

The present invention relates to a method for driving a liquid crystal display device. Further the present invention relates to a liquid crystal display device. Further the present invention relates to an electronic device including the liquid crystal display device.

BACKGROUND ART

Liquid crystal display devices ranging from a large display device such as a television receiver to a small display device such as a mobile phone have been spreading. From now on, products with higher added values will be needed and are being developed. In recent years, liquid crystal display devices with which viewers can experience virtual stereoscopic view have been developed in order to display a more realistic image.

In addition, there has been a growing interest in global environment and the development of liquid crystal display devices consuming less power has thus attracted attention. Thus, a driving method called a field sequential driving method (hereinafter, field sequential driving) has been developed. In field sequential driving, backlights of red (hereinafter, sometimes abbreviated to R), green (hereinafter, sometimes abbreviated to G), and blue (hereinafter, sometimes abbreviated to B) are switched within a predetermined period, and light of R, G, and B are supplied to a display panel. Therefore, a color filter is not necessarily provided for each pixel, and use efficiency of transmitting light from a backlight can be enhanced. Further, because one pixel can express R, G, and B, it is advantageous that improvement in definition is easily realized.

Patent Document 1 discloses a structure in which a left image for a left eye and a right image for a right eye are alternately displayed at high speed with field sequential driving so that a viewer virtually perceives the images as a stereoscopic image.

REFERENCE

[Patent Document 1]Japanese Published Patent Application No. 2003-259395

DISCLOSURE OF INVENTION

As described in Patent Document 1, it is necessary to frequently repeat turning on and off a light source of a backlight in order that a 3D (three-dimensional or stereoscopic) image be displayed with field sequential driving. In the case of turning on the backlight in inputting the image signal, such driving causes a problem in that display is perceived before writing an image signal to each pixel has been finished. Therefore, in order to avoid the display problem, the backlight is necessarily turned off whenever an image signal is written. However, with the structure in which the light is switched, which is emitted from the backlight, and which corresponds to respective colors, and the light are repeatedly turned on/off, a driver circuit operates by which a light source corresponding to colors is driven and switched; accordingly, power consumption is increased.

It is an object of an embodiment of the present invention to provide a specific driving method for lower power consumption in displaying a 3D image with field sequential driving.

An embodiment of the present invention is a driving method of a liquid crystal display device with which a stereoscopic image is perceived with a liquid crystal display device configured to switch an image for a left eye and an image for a right eye to display the image for the left eye or the image for the right eye, and a pair of glasses having a switching means with which the image for the left eye and the image for the right eye are switched in synchronization with display of the image for the left eye or the image for the right eye in order that the left or right eye of a viewer selectively perceives the image for the left eye or the image for the right eye. The image for the left eye and the image for the right eye are perceived by the left eye or right eye in a mixed color by switching light which is emitted from a backlight portion, and which corresponds to a plurality of colors, within a predetermined period. The light which is emitted from the backlight portion are continuously emitted during a lighting period for the left eye or a lighting period for the right eye which corresponds to one of the plurality of colors.

An embodiment of the present invention is a driving method of a liquid crystal display device with which a stereoscopic image is perceived with a liquid crystal display device configured to switch an image for a left eye and an image for a right eye to display the image for the left eye or the image for the right eye, and a pair of glasses having a switching means with which the image for the left eye and the image for the right eye are switched in synchronization with display of the image for the left eye or the image for the right eye in order that the left or right eye of a viewer selectively perceives the image for the left eye or the image for the right eye. The image for the left eye and the image for the right eye are perceived by the left eye or right eye in a mixed color by switching light which is emitted from a backlight portion, and which corresponds to a plurality of colors, within a predetermined period. The light which is emitted from the backlight portion are continuously emitted during a lighting period for the left eye or a lighting period for the right eye which corresponds to one of the plurality of colors. When the image for the left eye and the image for the right eye are switched, the light which is emitted from the backlight portion toward the left eye and the right eye are blocked with the pair of glasses having the switching means.

An embodiment of the present invention is a driving method of a liquid crystal display device with which a stereoscopic image is perceived with a liquid crystal display device configured to switch an image for a left eye and an image for a right eye to display the image for the left eye or the image for the right eye, and a pair of glasses having a switching means with which the image for the left eye and the image for the right eye are switched in synchronization with display of the image for the left eye or the image for the right eye in order that the left or right eye of a viewer selectively perceives the image for the left eye or the image for the right eye. The image for the left eye and the image for the right eye are perceived by the left eye or right eye in a mixed color by switching light which is emitted from a backlight portion, and which corresponds to colors of red, green, and blue, within a predetermined period. The light which is emitted from the backlight portion are continuously emitted during a lighting period for the left eye or a lighting period for the right eye which corresponds to one of the colors of the red, the green, and the blue.

An embodiment of the present invention is a driving method of a liquid crystal display device with which a stereoscopic image is perceived with a liquid crystal display device configured to switch an image for a left eye and an image for a right eye to display the image for the left eye or the image for the right eye, and a pair of glasses having a switching means with which the image for the left eye and the image for the right eye are switched in synchronization with display of the image for the left eye or the image for the right eye in order that the left or right eye of a viewer selectively perceives the image for the left eye or the image for the right eye. The image for the left eye and the image for the right eye are perceived by the left eye or right eye in a mixed color by switching light which is emitted from a backlight portion, and which corresponds to red, green, and blue, within a predetermined period. The light which is emitted from the backlight portion are continuously emitted during a lighting period for the left eye or a lighting period for the right eye which corresponds to the red, the green, and the blue. When the image for the left eye and the image for the right eye are switched, the light which is emitted from the backlight portion toward the left eye and the right eye are blocked with the pair of glasses having the switching means.

An embodiment of the present invention is a driving method of a liquid crystal display device with which a stereoscopic image is perceived with a liquid crystal display device configured to switch an image for a left eye and an image for a right eye to display the image for the left eye or the image for the right eye, and a pair of glasses having a switching means with which the image for the left eye and the image for the right eye are switched in synchronization with display of the image for the left eye or the image for the right eye in order that the left or right eye of a viewer selectively perceives the image for the left eye or the image for the right eye. The image for the left eye and the image for the right eye are perceived by the left eye or right eye in a mixed color by switching light which is emitted from a backlight portion, and which corresponds to colors of red, green, blue, and white, within a predetermined period. The light which is emitted from the backlight portion are continuously emitted during a lighting period for the left eye or a lighting period for the right eye which corresponds to one of the colors of the red, the green, the blue, and the white.

An embodiment of the present invention is a driving method of a liquid crystal display device with which a stereoscopic image is perceived with a liquid crystal display device configured to switch an image for a left eye and an image for a right eye to display the image for the left eye or the image for the right eye, and a pair of glasses having a switching means with which the image for the left eye and the image for the right eye are switched in synchronization with display of the image for the left eye or the image for the right eye in order that the left or right eye of a viewer selectively perceives the image for the left eye or the image for the right eye. The image for the left eye and the image for the right eye are perceived by the left eye or right eye in a mixed color by switching light which is emitted from a backlight portion, and which corresponds to red, green, blue, and white within a predetermined period. The light which is emitted from the backlight portion are continuously emitted during a lighting period for the left eye or a lighting period for the right eye which corresponds to the red, the green, the blue, and the white. When the image for the left eye and the image for the right eye are switched, the light which is emitted from the backlight portion toward the left eye and the right eye are blocked with the pair of glasses having the switching means.

In the driving method of the liquid crystal display device according to an embodiment of the present invention, the light which may be emitted from the backlight portion have colors of cyan, magenta, and yellow.

In the driving method of the liquid crystal display device according to an embodiment of the present invention, the light which is emitted from the backlight portion may be light emitted from a light-emitting diode.

In the driving method of the liquid crystal display device according to an embodiment of the present invention, a plurality of pixels of the liquid crystal display device may include a liquid crystal element and a transistor for controlling the liquid crystal element, and the liquid crystal element may include a liquid crystal material exhibiting a blue phase.

In the driving method of the liquid crystal display device according to an embodiment of the present invention, a semiconductor layer of the transistor may include an oxide semiconductor.

An embodiment of the present invention can realize lower power consumption in displaying a 3D image with field sequential driving.

BEST MODE FOR CARRYING OUT THE INVENTION

Figure 1A:
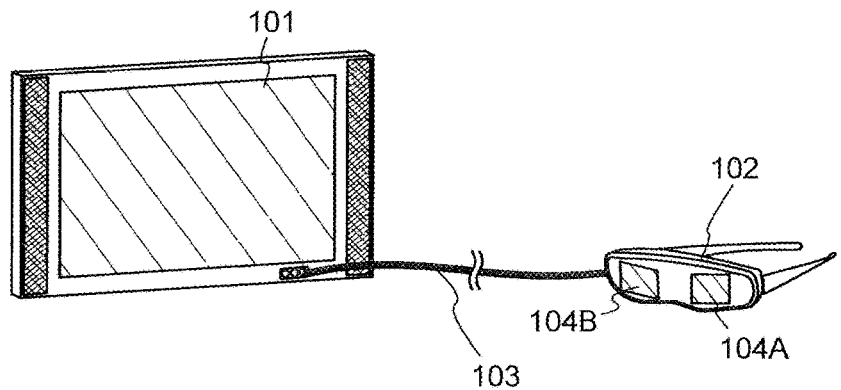
FIGS. 1A and 1B are perspective views illustrating one embodiment of the present invention.

Hereinafter, embodiments of the present invention will be described with reference to the accompanying drawings. However, the present invention can be carried out in many different modes, and it is easily understood by those skilled in the art that modes and details of the present invention can be modified in various ways without departing from the purpose and the scope of the present invention. Therefore, this invention is not interpreted as being limited to the description of the embodiments below. Note that identical portions or portions having the same function in all drawings illustrating the structure of the invention that are described below are denoted by the same reference numerals.

Note that the size, the thickness of a layer, distortion of the waveform of a signal, and a region of each structure illustrated in the drawings and the like in the embodiments are exaggerated for simplicity in some cases. Therefore, embodiments of the present invention are not limited to such scales.

Note that terms "first", "second", "third" to "Nth" (N is a natural number) employed in this specification are used in order to avoid confusion between components and do not set a limitation on number.

[Embodiment 1]

In order to describe a driving method of a liquid crystal display device, a structure of a liquid crystal display device capable of displaying a 3D (three-dimensional or stereoscopic) image is explained first.

In the driving method of the liquid crystal display device in this embodiment, a stereoscopic image can be perceived with a liquid crystal display device switching an image for a left eye and an image for a right eye to display the image for the left eye or the image for the right eye, and a pair of glasses having a switching means with which the images are switched in synchronization with display of the image for the left eye or the image for the right eye in order that the left or right eye of a viewer may selectively perceive the image for the left eye or the image for the right eye (hereinafter, abbreviated to glasses).

For specific description, FIG. 1A shows a perspective view in which a liquid crystal display device 101 is connected to glasses 102 with a cable 103. In the glasses 102, shutters of a left panel 104A for a left eye and a right panel 104B for a right eye are alternately opened and closed. Synchronized with opening and closing of the shutters, the image for the left eye and the image for the right eye are alternately displayed on the liquid crystal display device 101. Thus, a viewer can perceive the image on the liquid crystal display device 101 as a 3D image.

The shutters provided for the left panel 104A for the left eye and the right panel 104B for the right eye of the glasses 102 may include a liquid crystal element having electrodes with a liquid crystal material provided therebetween. The liquid crystal material may include ferroelectric liquid crystal, a liquid crystal material which exhibits a blue phase, or the like. Note that by opening the shutter, light from a backlight portion in accordance with an image of the liquid crystal display device 101 is led to the left or right eye of the viewer. In addition, by closing the shutter, light from the backlight portion to the left or right eye of the viewer is blocked.

Although in FIG. 1A, the cable 103 is shown as a means for electrical connection between the liquid crystal display device 101 and the glasses 102, signals between the liquid crystal display device 101 and the glasses 102 may be synchronized by a wireless signal. In a structure in which the signals between the liquid crystal display device 101 and the glasses 102 are synchronized by the wireless signal, the glasses 102 may be provided with a secondary battery, such as a lithium-ion battery, as an electrical storage means.

Figure 1B:
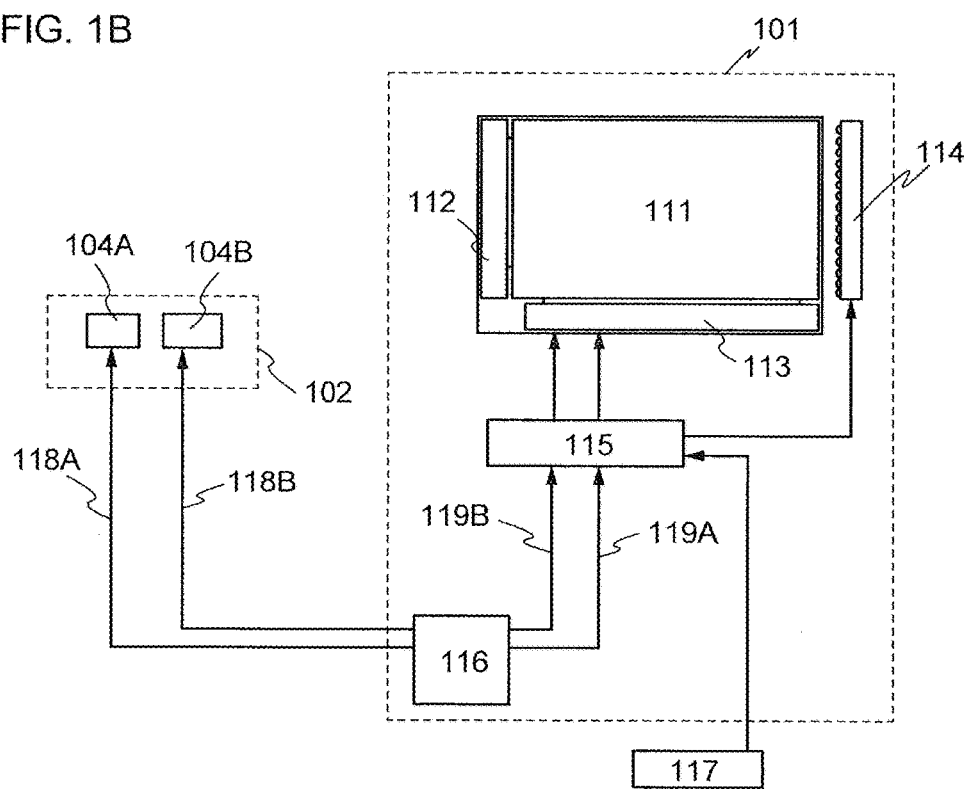

FIG. 1B shows a block diagram of a main structure of the liquid crystal display device 101 and the glasses 102.

The liquid crystal display device 101 illustrated in FIG. 1B includes a display control circuit 115, a display portion 111, a timing generator 116, a source line driver circuit 113, a backlight portion 114, and a gate line driver circuit 112.

The display control circuit 115 switches and outputs a signal for displaying a 2D (two-dimensional, or plane) image and a signal for displaying a 3D image, in accordance with operation with an external operation means 117 such as a keyboard or a remote controller. Specifically, in the case of displaying a 3D image, the display control circuit 115 supplies the following to the backlight portion 114, the source line driver circuit 113, and the gate line driver circuit 112: signals for displaying an image for the left eye and an image for the right eye with field sequential driving (for example, a start pulse, a clock signal, image signals of the image for the left eye and the image for the right eye, and a control signal of a backlight).

Note that in the case where the image for the left eye and the image for the right eye are displayed with the field sequential driving, light of a plurality of colors, which is emitted from the backlight portion, is switched within a predetermined period and is delivered to the left and right eyes of the viewer, and the viewer perceive color display in a mixed color. Note that when the light emitted from the backlight portion is a light emitted from a light-emitting diode, the size of a light source can be reduced, power consumption can be reduced, and life can be long. At that time, the backlight portion is provided with light-emitting diodes which are the light sources corresponding to colors of R, G, B, and the like.

Note that the display control circuit 115 is supplied with the following from the timing generator 116: a signal for synchronizing the image signals of the image for the left eye and the image for the right eye with the left panel 104A for the left eye and the right panel 104B for the right eye of the glasses 102. Note that the timing generator 116 supplies the following to the glasses 102: a signal for synchronizing display of the image for the left eye and movement of the shutter of the left panel 104A for the left eye, and a signal for synchronizing display of the image for the right eye and movement of the shutter of the right panel 104B for the right eye. In other words, a synchronization signal 119A of the image for the left eye is supplied to the display control circuit 115, and a synchronization signal 118A for opening the shutter of the left panel 104A for the left eye is input to the left panel 104A for the left eye. Further, a synchronization signal 119B of the image for the right eye is supplied to the display control circuit 115, and a synchronization signal 118B for opening the shutter of the right panel 104B for the right eye is input to the right panel 104B for the right eye.

Figure 2:
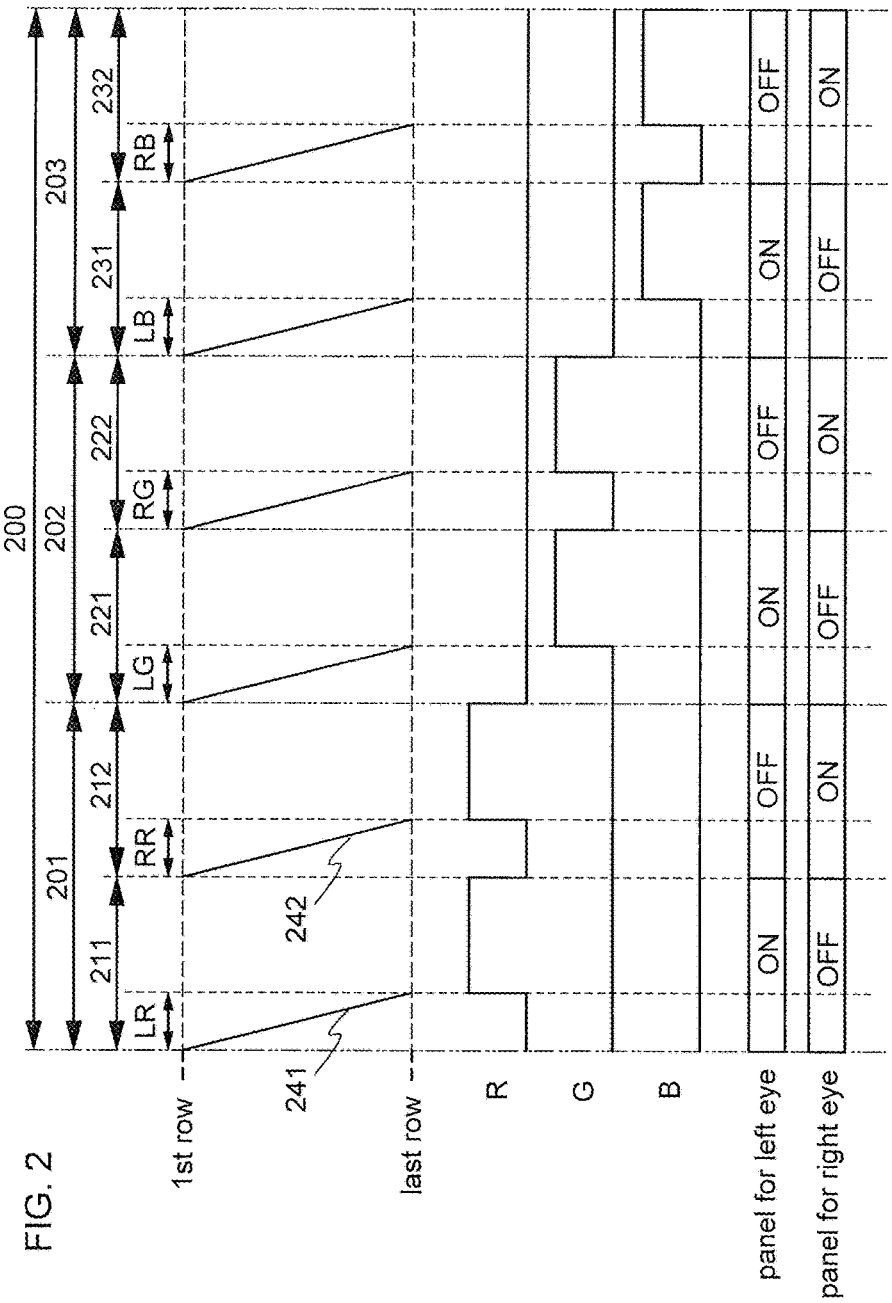
FIG. 2 is a timing chart according to one embodiment of the present invention.

Next, FIG. 2 shows a timing chart of the structure in FIGS. 1A and 1B, and the driving method of the liquid crystal display device of this embodiment is described.

FIG. 2 shows a timing chart in a stereoscopic image display period 200 which is a period in which one image for the left eye and one image for the right eye are displayed so that a viewer can perceive a stereoscopic image. With a series of different stereoscopic image display periods 200, the viewer can perceive a stereoscopic moving image. The stereoscopic image display period 200 has an R-lighting period 201 for performing display with a red (R) backlight, a G-lighting period 202 for performing display with a green (G) backlight, and a B-lighting period 203 for performing display with a blue (B) backlight. The R-lighting period 201 has an R-lighting period 211 for a left eye and an R-lighting period 212 for a right eye. The G-lighting period 202 has a G-lighting period 221 for the left eye and a G-lighting period 222 for the right eye. The B-lighting period 203 has a B-lighting period 231 for the left eye and a B-lighting period 232 for the right eye.

In the R-lighting period 211 for the left eye, a writing operation 241 to sequentially write image signals to gate signal lines (scan lines) from the first to the last row is performed in an R-writing period LR for the left eye, and a period for controlling the backlight portion to turn on the R backlight is provided after the R-writing period LR for the left eye. Further, the R-lighting period 211 for the left eye is a period in which the shutter of the left lens which is provided for the glasses so that the left eye of a viewer can perceive the image for the left eye is opened, and a period in which the shutter of the right lens which is provided for the glasses so that the right eye of the viewer can perceive the image for the right eye is closed.

Then, in the R-lighting period 212 for the right eye, a writing operation 242 to sequentially write image signals to gate signal lines (scan lines) from the first to the last row is performed in an R-writing period RR for the right eye, and a period for controlling the backlight portion to turn on the R backlight is provided after the R-writing period RR for a right eye. Further, the R-lighting period 212 for the right eye is a period in which the shutter of the right lens which is provided for the glasses so that the right eye of a viewer can perceive the image for the right eye is opened, and a period in which the shutter of the left lens which is provided for the glasses so that the left eye of the viewer can perceive the image for the left eye is closed.

Next, in the G-lighting period 221 for the left eye, an image signal writing operation and control of the G backlight to be turned on are performed as in the R-lighting period 211 for the left eye. Further, the G-lighting period 221 for the left eye is a period in which the shutter of the left lens is opened and the shutter of the right lens is closed. Then, in the G-lighting period 222 for the right eye, an image signal writing operation and control of the G backlight to be turned on are performed as in the R-lighting period 212 for the right eye. Further, the G-lighting period 222 for the right eye is a period in which the shutter of the right lens is opened and the shutter of the left lens is closed.

Next, in the B-lighting period 231 for the left eye, an image signal writing operation and control of the B backlight to be turned on are performed as in the R-lighting period 211 for the left eye. Further, the B-lighting period 231 for the left eye is a period in which the shutter of the left lens is opened and the shutter of the right lens is closed. Then, in the B-lighting period 232 for the right eye, an image signal writing operation and control of the B backlight to be turned on are performed as in the R-lighting period 212 for the right eye. Further, the B-lighting period 232 for the right eye is a period in which the shutter of the right lens is opened and the shutter of the left lens is closed.

Note that in description in this specification, "the shutter is opened" or "the shutter is closed" corresponds to controlling voltage applied to a liquid crystal element of the left lens or the right lens. Thus, in drawings illustrating timing charts, opening the shutter is denoted by "ON" and closing the shutter is denoted by "OFF".

In the field sequential driving, the viewer perceives the image for the left eye or the image for the right eye while sequential lighting of the R, G and B backlights are repeated, as described in Patent Document 1. Therefore, in the structure in which a stereoscopic image is perceived by alternate and sequential display of the images for the left eye and the images for the right eye, it is necessary to turn on the R backlight, the G backlight, and the B backlight one after the other at high rate for each of the images for the left and right eyes; accordingly, there is a concern about an increase in power consumption.

On the other hand, in the timing chart of this embodiment in FIG. 2, the lighting period for the left eye and the lighting period for the right eye are sequentially provided in each of the R-lighting period 201, the G-lighting period 202, and the B-lighting period 203. The R lighting, the G lighting, and the B lighting are sequentially performed in each of displays of the images for the left eye and the right eye; thus, the number of switching operations of backlight lighting, such as switching from the R lighting to the G lighting, and switching from the G lighting to the B lighting, can be reduced. Therefore, power consumption needed for switching lightings of the backlights can be reduced. The larger the liquid crystal display device and the number of light sources of the backlight portion become, the more suitable the structure of this embodiment becomes.

Note that the timing chart in FIG. 2 shows a structure in which in the R-lighting period 201, the G-lighting period 202, and the B-lighting period 203, the backlight is turned off in an image signal writing operation in a period in which the lighting period for the left eye and the lighting period for the right eye are sequential, that is, for example, in the R-writing period RR for the right eye. That is a structure in which perception of a writing operation to each pixel is prevented, which may be caused when the backlight is on. Note that in the structure of this embodiment, in the case where opening and closing the shutters of the left panel for the left eye and the right panel for the right eye of the glasses are switched, the structure is realized in which the backlight is kept on, without the backlight turned off, in the image signal writing operation in the period in which the lighting period for the left eye and the lighting period for the right eye are sequential, that is, for example, in the R-writing period RR for the right eye. With the structure in which the backlight is kept on in the B-lighting period 201, the G-lighting period 202, and the B-lighting period 203, power consumption can be reduced in comparison with the structure in which lighting of the R, G, and B backlights is repeated and the structure of the timing chart in FIG. 2.

Note that in the case of displaying an image with the field sequential driving, it is preferable that lighting periods of R, G, and B in the stereoscopic image display period 200 be short so that display defects due to color breaking is hardly visible. Therefore, in view of enlargement of the liquid crystal display device, a transistor with a semiconductor layer including an oxide semiconductor is preferable as a transistor provided for each pixel of the liquid crystal display device for shortening the lighting period. A transistor with a semiconductor layer including an oxide semiconductor can be driven at high speed because of its high field effect mobility in comparison with a transistor with a semiconductor layer including amorphous silicon, can be fabricated without a process such as laser irradiation, and can realize formation of a transistor over a large substrate; accordingly, the transistor with a semiconductor layer including an oxide semiconductor is preferable. Further, a liquid crystal material of a liquid crystal element provided in the liquid crystal display device is preferably a liquid crystal material which can respond to high-speed driving. For example, as a liquid crystal material, ferroelectric liquid crystal, a liquid crystal material which exhibits a blue phase, and a liquid crystal material which exhibits a nematic phase with a narrow cell gap are preferably used.

Note that the structure in which three colors of R, G, and B are used as colors of light sources of the backlights is described in FIG. 2; however, colors such as Y (yellow), C (cyan), and M (magenta) may be used. A structure in which as another color in addition to R, G, and B, white (hereinafter, sometimes abbreviated to W) obtained by lighting R, G, and B at the same time is used is shown in FIG. 5 and described in addition to the structure in FIG. 2.

Figure 5:
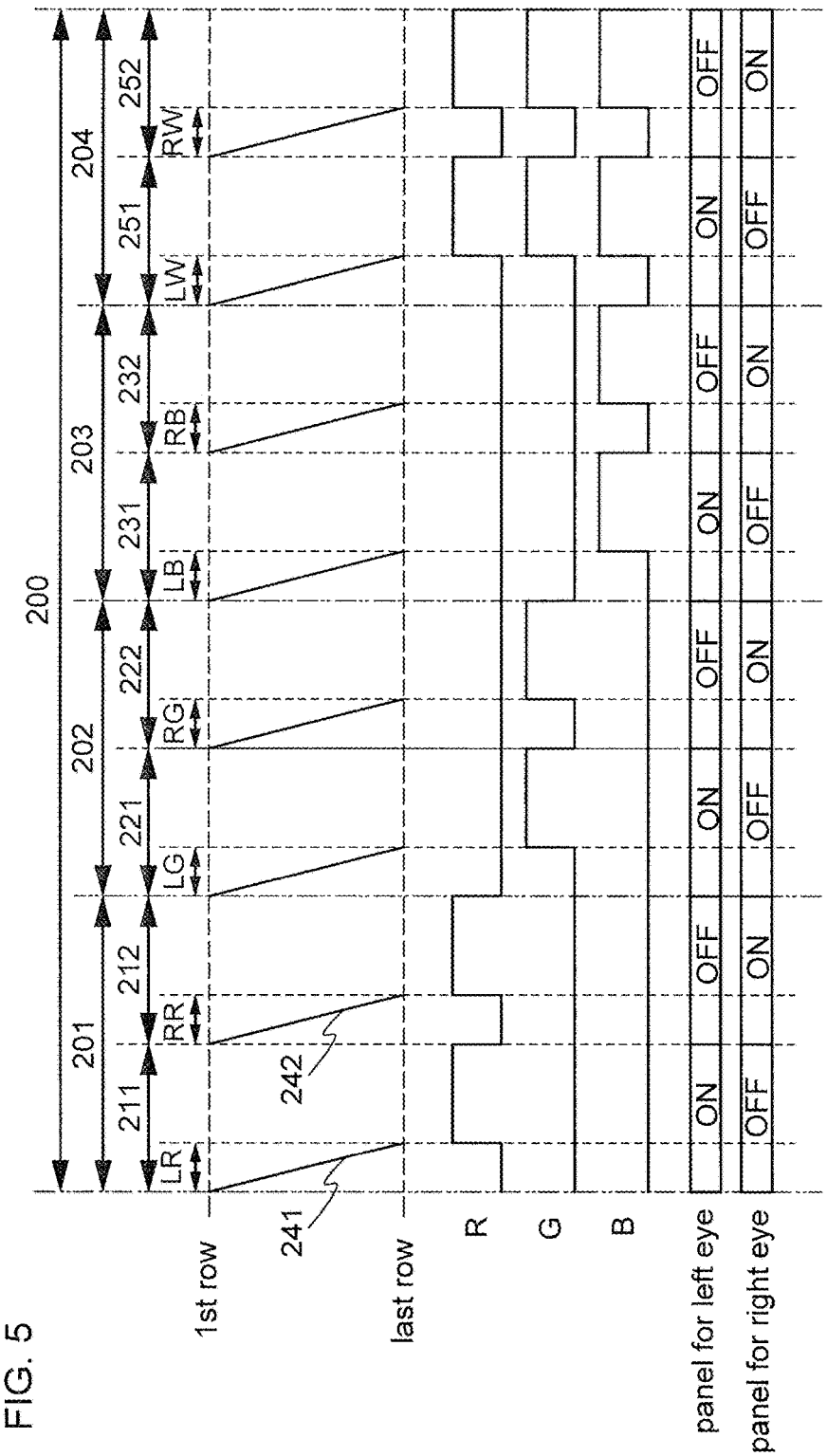
FIG. 5 is a timing chart according to one embodiment of the present invention.

A timing chart in FIG. 5 is different from that in FIG. 2 in that a W-lighting period 204 is provided in the stereoscopic image display period 200. The W-lighting period 204 has a W-lighting period 251 for a left eye and a W-lighting period 252 for a right eye. In the timing chart in FIG. 5, in the W-lighting period 251 for the left eye which comes after the B-lighting period 203, an image signal writing operation is performed as in the R-lighting period 211 for the left eye, and control of the R, G, and B backlights to be turned on are performed. Further, the G-lighting period 221 for the left eye is a period in which the shutter of the left lens is opened and the shutter of the right lens is closed. Then, in the W-lighting period 252 for the right eye, an image signal writing operation and control of the R, G, and B backlights to be turned on are performed as in the R-lighting period 212 for the right eye. Further, the W-lighting period 252 for the right eye is a period in which the shutter of the right lens is opened and the shutter of the left lens is closed.

A color corresponding to white in addition to R, G, and B is added as in the timing chart in FIG. 5, so that display defects due to color breaking which occurs in displaying an image with the field sequential driving can hardly be visible. Therefore, reduction in color breaking in the field sequential driving can be achieved.

In addition to the structure described with reference to FIG. 5 in which white obtained by lighting R, G, and B at the same time is used, the structure in which a light source capable of emitting white light alone is used is described with reference to FIG. 6.

Figure 6:
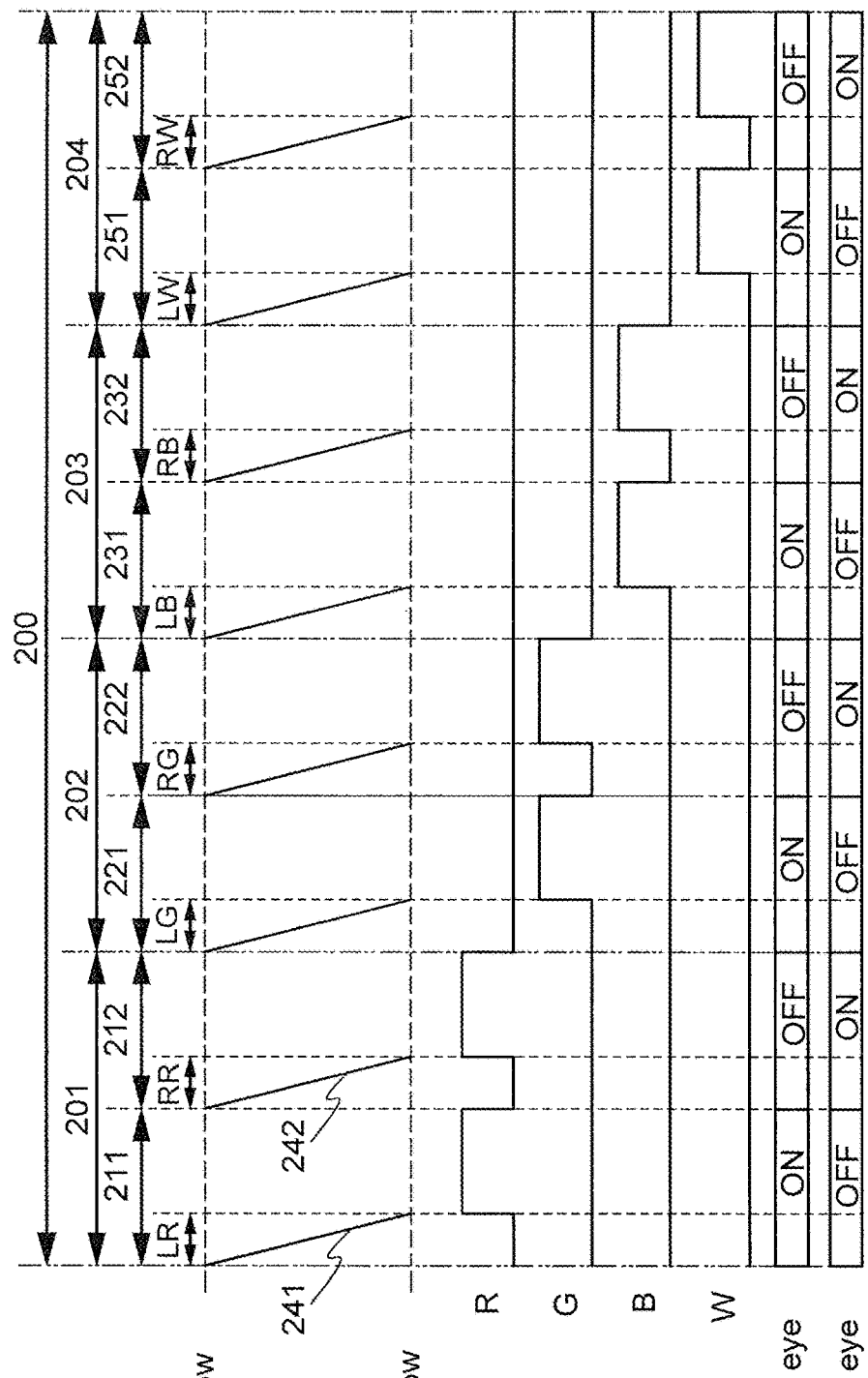
FIG. 6 is a timing chart according to one embodiment of the present invention.

A timing chart in FIG. 6 is different from that in FIG. 5 in that control of turning on a W-light source separately provided in addition to light sources of R, G, and B is performed in the W-lighting period 204 which comes after the B-lighting period 203. As in the structure in FIG. 6, the W-light source separately provided in addition to light sources of R, G, and B is turned on in the W-lighting period 251 for the left eye and the W-lighting period 252 for the right eye, so that the number of light sources which are turned on can be reduced in comparison with the structure in which R, G, and B are lit at the same time, and power consumption can also be reduced.

Figure 3:
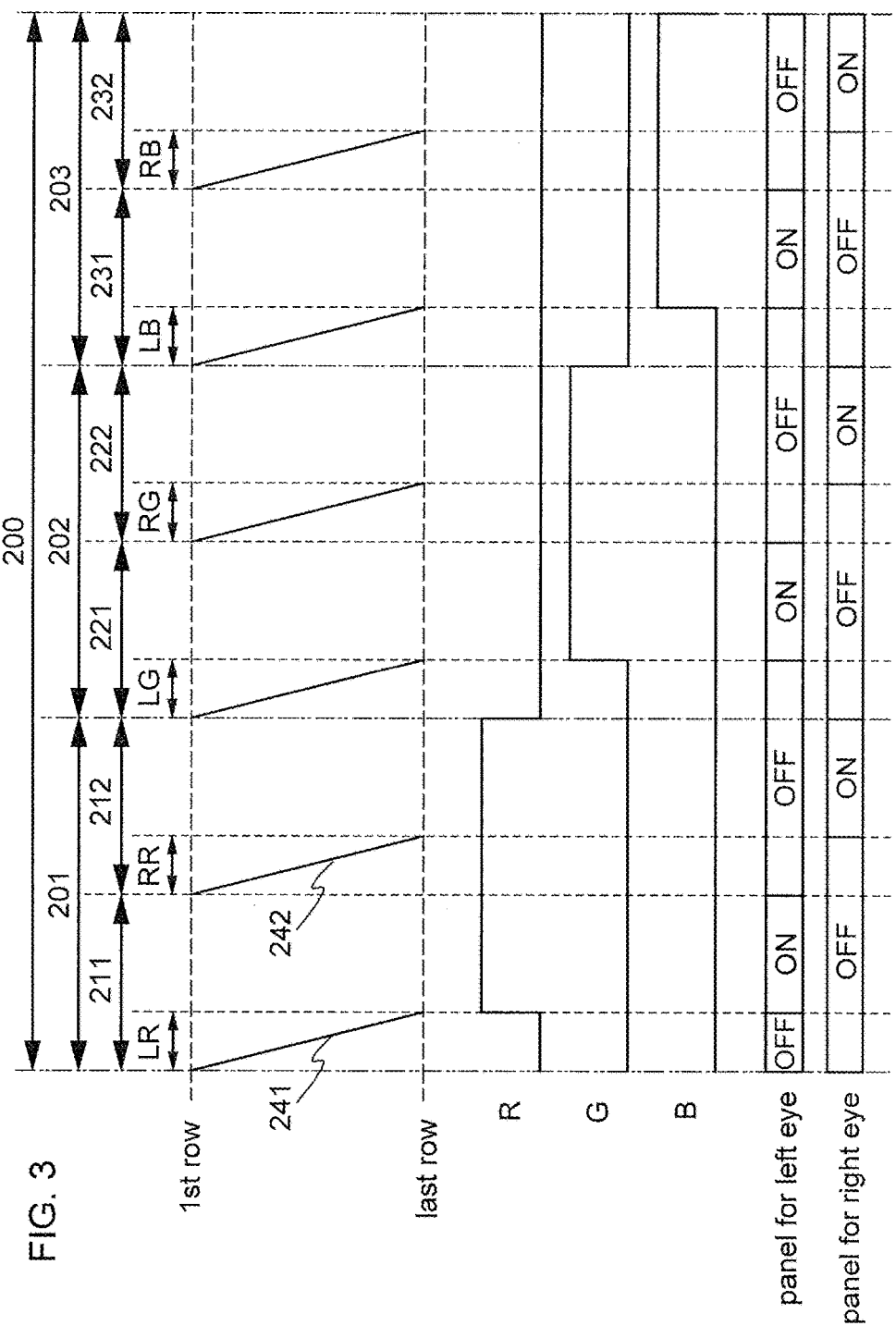
FIG. 3 is a timing chart according to one embodiment of the present invention.

FIG. 3 shows a timing chart different from that in FIG. 2.

FIG. 3 shows the timing chart in the stereoscopic image display period 200, as in FIG. 2. The stereoscopic image display period 200 has the R-lighting period 201, the G-lighting period 202, and the B-lighting period 203, as in FIG. 2. The R-lighting period 201 has the R-lighting period 211 for a left eye and the R-lighting period 212 for a right eye, as in FIG. 2. The G-lighting period 202 has the G-lighting period 221 for a left eye and the G-lighting period 222 for a right eye, as in FIG. 2. The B-lighting period 203 has the B-lighting period 231 for a left eye and the B-lighting period 232 for a right eye, as in FIG. 2.

In the R-writing period LR for the left eye of the R-lighting period 211 for the left eye, the writing operation 241 to sequentially write image signals to gate signal lines (scan lines) from the first to the last row is performed, and the backlight portion is controlled so as to turned off the R backlight. Further, the R-writing period LR for the left eye is a period in which the shutters of the left panel for the left eye and the right panel for the right eye are closed. After the image signal writing operation 241 is performed up to the last row, the R backlight is turned on, the shutter of the left lens is opened, and the shutter of the right lens is closed.

Note that in the structure in FIG. 3, the shutters of the left panel for the left eye and the right panel for the right eye are closed in the image signal writing operation of the R-writing period LR for the left eye. Accordingly, the backlight portion may be controlled so that the R backlight is turned on in the image signal writing operation of the R-writing period LR for the left eye.

Then, in the R-writing period RR for the right eye of the R-lighting period 212 for the right eye, the writing operation 242 to sequentially write image signals to the gate signal lines (scan lines) from the first to the last row is performed, and the backlight portion is controlled so as to turn on the R backlight. Further, the R-writing period RR for the right eye is a period in which the shutters of the left panel for the left eye and the right panel for the right eye are closed. After the image signal writing operation 242 is performed up to the last row, the R backlight is turned on, the shutter of the right lens is opened, and the shutter of the left lens is closed.

Note that in the structure in FIG. 3, the shutters of the left panel for the left eye and the right panel for the right eye are closed in the image signal writing operation of the R-writing period RR for the right eye. Accordingly, the backlight portion can be controlled so that the R backlight is turned on in the image signal writing operation of the R-writing period RR for the right eye. In other words, with the structure of the timing chart in FIG. 3, the number of operations for switching on and off the R backlight in the R-lighting period 201 can be reduced. Therefore, power consumption needed for switching lightings of the backlights can be reduced. The larger the liquid crystal display device and the number of light sources of the backlight portion become, the more suitable the structure of this embodiment becomes.

Next, in the G-lighting period 221 for the left eye, an image signal writing operation and control of the G backlight to be turned on are performed as in the R-lighting period 211 for the left eye. Further, the shutters of the left panel for the left eye and the right panel for the right eye are closed in the image signal writing operation. After the writing operation is finished, the G-lighting period 221 for the left eye is a period in which the shutter of the left lens is opened and the shutter of the right lens is closed. Then, in the G-lighting period 222 for the right eye, an image signal writing operation and control of the G backlight to be turned on are performed as in the R-lighting period 212 for the right eye. Further, the shutters of the left panel for the left eye and the right panel for the right eye are closed in the image signal writing operation. After the writing operation is finished, the G-lighting period 222 for the right eye is a period in which the shutter of the right lens is opened and the shutter of the left lens is closed.

Next, in the B-lighting period 231 for the left eye, an image signal writing operation and control of the G backlight to be turned on are performed as in the R-lighting period 211 for the left eye. Further, the shutters of the left panel for the left eye and the right panel for the right eye are closed in the image signal writing operation. After the writing operation is finished, the B-lighting period 231 for the left eye is a period in which the shutter of the left lens is opened and the shutter of the right lens is closed. Then, in the B-lighting period 232 for the right eye, an image signal writing operation and control of the B backlight to be turned on are performed as in the R-lighting period 212 for the right eye. Further, the shutters of the left panel for the left eye and the right panel for the right eye are closed in the image signal writing operation. After the writing operation is finished, the B-lighting period 232 for the right eye is a period in which the shutter of the right lens is opened and the shutter of the left lens is closed.

Figure 7:
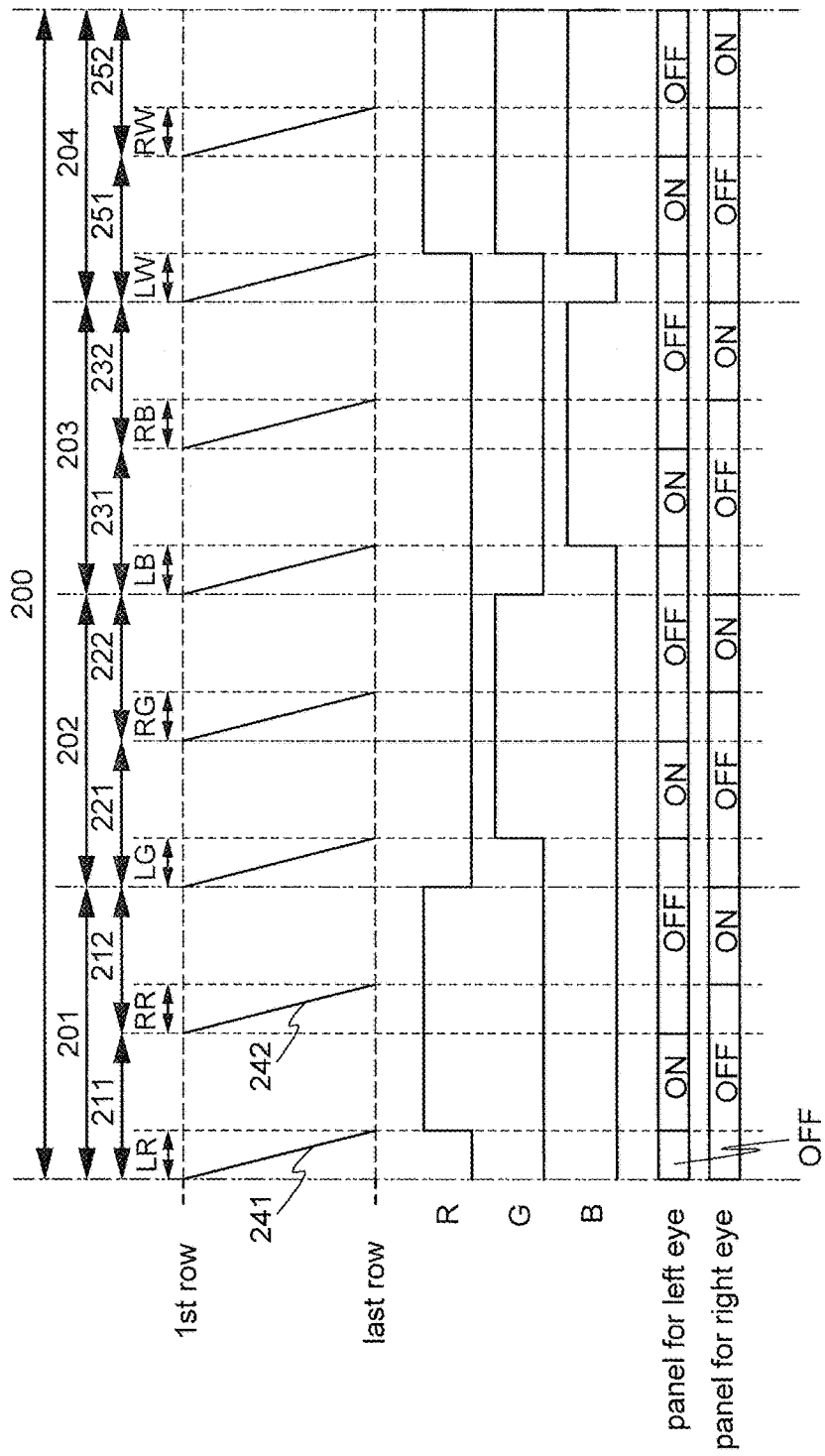
FIG. 7 is a timing chart according to one embodiment of the present invention.

Note that for the structure in FIG. 3, the structure can be used in which as another color in addition to R, G, and B, white obtained by lighting R, G, and B at the same time is used, as in FIG. 5. FIG. 7 shows a specific timing chart. A color corresponding to white in addition to R, G, and B is added as in the timing chart in FIG. 7, so that display defects due to color breaking which occurs in displaying an image with the field sequential driving can hardly be visible, in addition to the effect of the structure in FIG. 3. Therefore, reduction in color breaking in the field sequential driving can be achieved.

Figure 8:
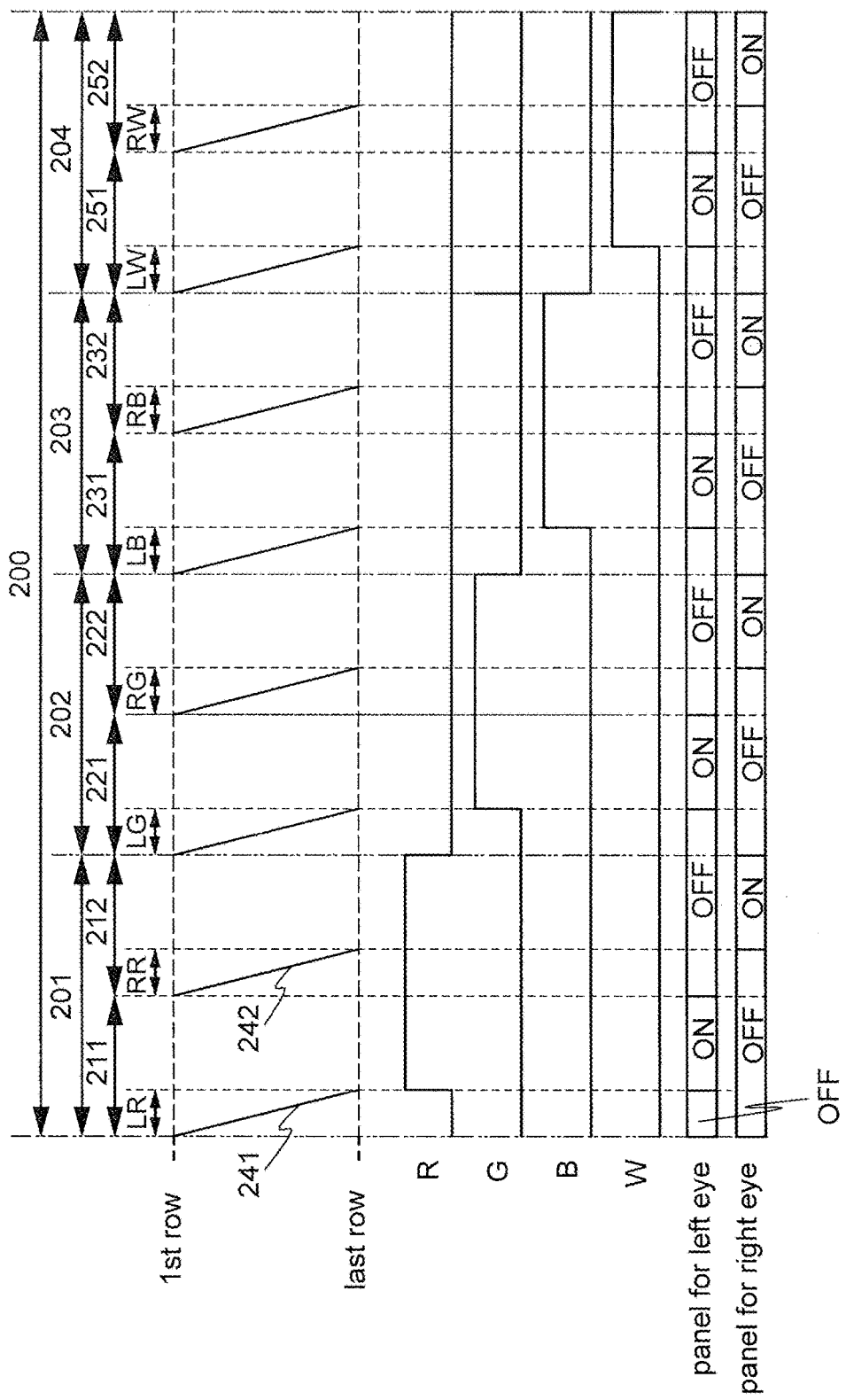
FIG. 8 is a timing chart according to one embodiment of the present invention.

In addition to the structure described in FIG. 7 in which white obtained by lighting R, G, and B at the same time is used, the structure in which a light source capable of emitting white light alone can be obtained is used is described with reference to FIG. 8. As in the structure in FIG. 8, the W-light source separately provided in addition to light sources of R, G, and B is turned on in the W-lighting period 251 for the left eye and the W-lighting period 252 for the right eye, so that the number of light sources which are turned on can be reduced in comparison with the structure in which R, G, and B are lit at the same time, and power consumption can also be reduced.

Figure 4:
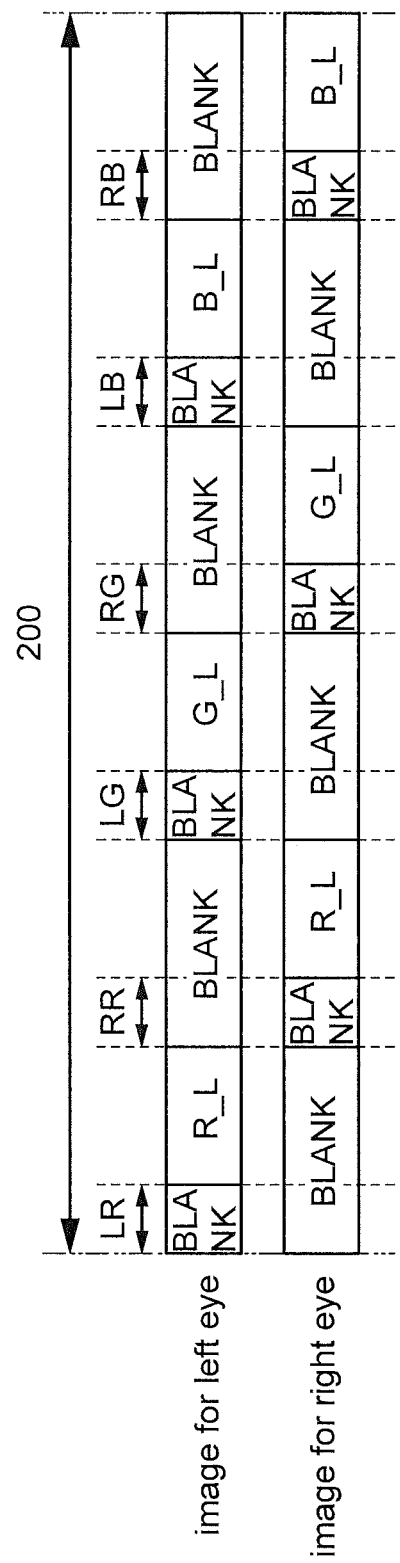
FIG. 4 is a timing chart according to one embodiment of the present invention.

Then, FIG. 4 shows a diagram illustrating how the left and right eyes of the viewer perceive the images displayed in the stereoscopic image display period 200 with the structure illustrated in the timing charts of FIG. 2 and FIG. 3.

As shown in FIG. 4, in the timing charts of FIG. 2 and FIG. 3, in the stereoscopic image display period 200, the left eye of the viewer perceives an image displayed by lighting the R backlight, an image displayed by lighting the G backlight, and an image displayed by lighting the B backlight as an image in a mixed color (in FIG. 4, the image for the left eye), and the right eye of the viewer perceives an image displayed by the R backlight, an image displayed by the G backlight, and an image displayed by the B backlight as an image in a mixed color (in FIG. 4, the image for the right eye).

In FIG. 4, the left eye of the viewer perceives the image for the left eye through the following periods: the R-writing period LR for the left eye in which the image not perceived (BLANK in FIG. 4), an R-lighting period (R_L in FIG. 4), a period in which the image is not perceived because of display of the image for the right eye (BLANK in FIG. 4), a G-writing period LG for the left eye in which the image is not perceived (BLANK in FIG. 4), the G-lighting period (R_L in FIG. 4), a period in which the image is not perceived because of display of the image for the right eye (BLANK in FIG. 4), a B-writing period LB for the left eye in which the image is not perceived (BLANK in FIG. 4), the B-lighting period (B_L in FIG. 4), and a period in which the image is not perceived because of display of the image for the right eye (BLANK in FIG. 4). In other words, the left eye of the viewer perceives the image for the left eye in a mixed color by switching light which is emitted from the backlight portion, and which corresponds to a plurality of colors (RGB), within a predetermined period.

In FIG. 4, the right eye of the viewer perceives the image for the right eye through the following periods: a period in which the image is not perceived because of display of the image for the right eye (BLANK in FIG. 4), the R-writing period RR for the right eye in which the image not perceived (BLANK in FIG. 4), the R-lighting period (R_L in FIG. 4), a period in which the image is not perceived because of display of the image for the left eye (BLANK in FIG. 4), a G-writing period RG for the right eye in which the image is not perceived (BLANK in FIG. 4), the G-lighting period (R_L in FIG. 4), a period in which the image is not perceived because of display of the image for the left eye (BLANK in FIG. 4), a B-writing period RB for the right eye in which the image is not perceived (BLANK in FIG. 4), and the B-lighting period (B_L in FIG. 4). In other words, the left eye of the viewer perceives the image for the right eye in a mixed color by switching light which is emitted from the backlight portion, and which corresponds to a plurality of colors (RGB), within a predetermined period.

Within the stereoscopic image display period 200, as illustrated in FIG. 4, the left and right eyes of the viewer perceive an image displayed by lighting the R backlight, an image displayed by lighting the G backlight, and an image displayed by lighting the B backlight. As shown in FIG. 4, in the timing charts of FIG. 2 and FIG. 3, a period in which the backlight emits light which corresponds to a plurality of colors (RGB) is provided so that colors are mixed to be perceived as display of the image, and a period in which display of the image is not perceived (BLANK in FIG. 4) is provided in the period in which the backlights emit light which corresponds to a plurality of colors (RGB). Thus, with the driving method of this embodiment, the viewer perceives display of the image in which a black image is appropriately inserted; therefore, a residual image, blur, color-breaking, and the like in displaying a moving image can be suppressed, which results in improvement of moving image display characteristics.

This embodiment can be combined with any of the other embodiments in this specification as appropriate.

[Embodiment 2]

In this embodiment, an example of a structure of a backlight portion (also referred to as a backlight or a backlight unit) which can be used for the liquid crystal display device disclosed in this specification will be described with reference to FIGS. 9A to 9C.

Figure 9A:
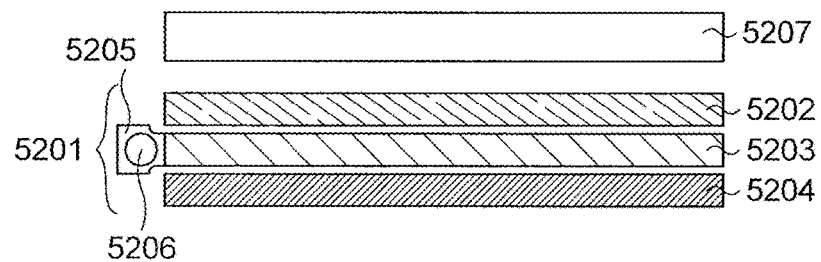
FIGS. 9A to 9C are drawings for illustrating one embodiment of the present invention.

FIG. 9A illustrates an example of a liquid crystal display device including a what is called edge-light type backlight portion 5201 and a display panel 5207. An edge-light type has a structure in which a light source is provided at an end of the backlight portion and light from the light source is emitted from the entire light-emitting surface.

The backlight portion 5201 includes a diffusion plate 5202 (also referred to as a diffusion sheet), a light guide plate 5203, a reflection plate 5204, a lamp reflector 5205, and a light source 5206. Note that the backlight portion 5201 may also include a luminance improvement film or the like.

The light source 5206 has a function of emitting light with different colors (RGB) as necessary. For example, as the light source 5206, a cold cathode fluorescent lamp (CCFL) provided with a color filter, a light emitting diode, an EL element, or the like is used.

Figure 9B:
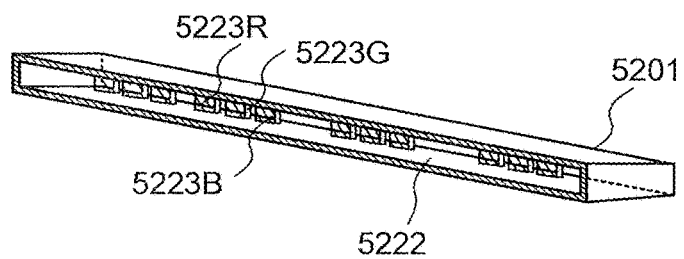

FIG. 9B illustrates a detailed structure of an edge-light type backlight portion. Note that description of the diffusion plate, the light guide plate, the reflection plate, and the like is omitted.

The backlight portion 5201 illustrated in FIG. 9B has a structure in which light-emitting diodes (LEDs) 5223R, 5223G, and 5223B corresponding to R, G, and B, respectively are used as light sources. The light-emitting diodes (LEDs) 5223R, 5223G, and 5223B corresponding to R, G, and B, respectively are provided at a predetermined interval. In addition, a lamp reflector 5222 is provided to efficiently reflect light from the light-emitting diodes (LEDs) 5223R, 5223G, and 5223B corresponding to R, G, and B, respectively. Note that a diode which emits white light may be provided as a light source in addition to the light-emitting diodes (LEDs) 5223R, 5223G, and 5223B corresponding to R, G, and B, respectively.

Figure 9C:
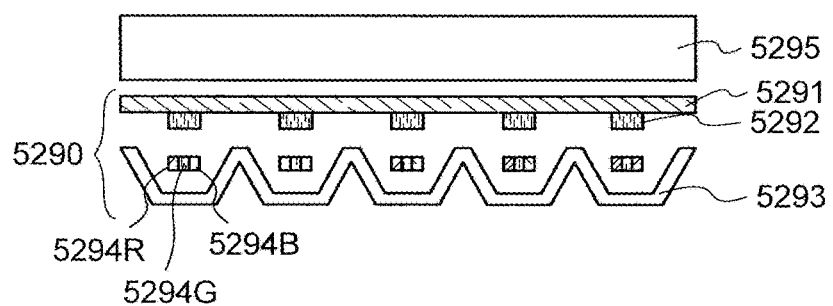

FIG. 9C illustrates an example of a liquid crystal display device including a what is called direct-below-type backlight portion and a liquid crystal panel. A direct-below type has a structure in which a light source is provided directly under a light-emitting surface and light from the light source is emitted from the entire light-emitting surface.

A backlight portion 5290 includes a diffusion plate 5291, a light-shielding portion 5292, a lamp reflector 5293, a liquid crystal panel 5295, and light-emitting diodes (LEDs) 5294R, 5294G and 5294B corresponding to R, G, and B, respectively.

Note that in the what is called direct-below-type backlight portion, an EL element which is a light-emitting element is used instead of a light-emitting diode (LED) serving as a light source, so that the thickness of the backlight portion can be reduced.

Note that the backlight portion described in FIGS. 9A to 9C may have a structure in which luminance is adjusted. For example, luminance is adjusted in accordance with illuminance around the liquid crystal display device or luminance is adjusted in accordance with an image signal for display may be employed.

This embodiment can be combined with any of the other embodiments as appropriate.

[Embodiment 3]

In this embodiment, an example of a transistor that can be applied to a liquid crystal display device disclosed in this specification will be described. There is no particular limitation on a structure of the transistor that can be applied to the liquid crystal display device disclosed in this specification. For example, a staggered transistor, a planar transistor, or the like having a top-gate structure in which a gate electrode is provided above an oxide semiconductor layer with a gate insulating layer interposed or a bottom-gate structure in which a gate electrode is provided below an oxide semiconductor layer with a gate insulating layer interposed, can be used. The transistor may have a single gate structure including one channel formation region, a double gate structure including two channel formation regions, or a triple gate structure including three channel formation regions. Alternatively, the transistor may have a dual gate structure including two gate electrode layers provided over and below a channel region with a gate insulating layer interposed. FIGS. 10A to 10D illustrate examples of cross-sectional structures of transistors. Each of the transistors illustrated in FIGS. 10A to 10D includes an oxide semiconductor as a semiconductor layer. An advantage of using an oxide semiconductor is that high field-effect mobility (the maximum value is 5 $cm^2$/Vsec or higher, preferably in the range of 10 $cm^2$/Vsec to 150 $cm^2$/Vsec) can be obtained when a transistor is on, and low off-state current (for example, off-state current per channel width is lower than 1 aA/μm, preferably lower than 10 zA/μm and lower than 100 zA/μm at 85° C.) can be obtained when the transistor is off.

Figure 10A:
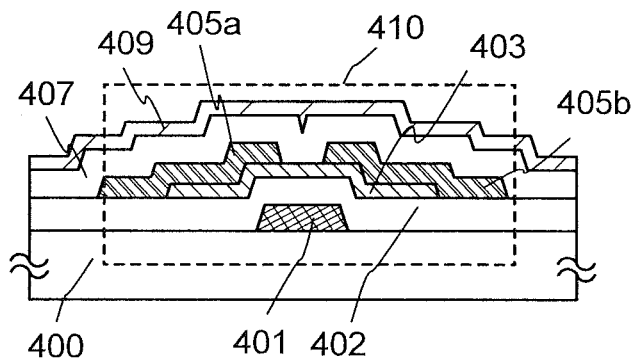
FIGS. 10A to 10D are each a cross-sectional view of one embodiment of the present invention.

A transistor 410 illustrated in FIG. 10A is one of bottom-gate transistors and is also referred to as an inverted staggered transistor.

The transistor 410 includes, over a substrate 400 having an insulating surface, a gate electrode layer 401, a gate insulating layer 402, an oxide semiconductor layer 403, a source electrode layer 405*a*, and a drain electrode layer 405*b*. An insulating film 407 is provided to cover the transistor 410 and be stacked over the oxide semiconductor layer 403. Further, a protective insulating layer 409 is formed over the insulating film 407.

Figure 10B:
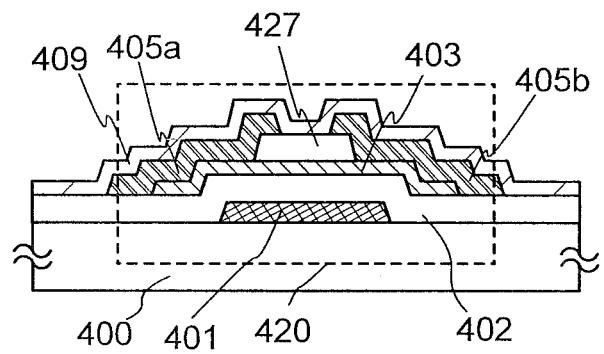

A transistor 420 illustrated in FIG. 10B is one of bottom-gate transistors referred to as a channel-protective type (also referred to as a channel-stop type) and is also referred to as an inverted staggered transistor.

The transistor 420 includes, over the substrate 400 having an insulating surface, the gate electrode layer 401, the gate insulating layer 402, the oxide semiconductor layer 403, an insulating layer 427 functioning as a channel protective layer covering a channel formation region of the oxide semiconductor layer 403, the source electrode layer 405*a*, and the drain electrode layer 405*b*. Further, the protective insulating layer 409 is formed to cover the transistor 420.

Figure 10C:
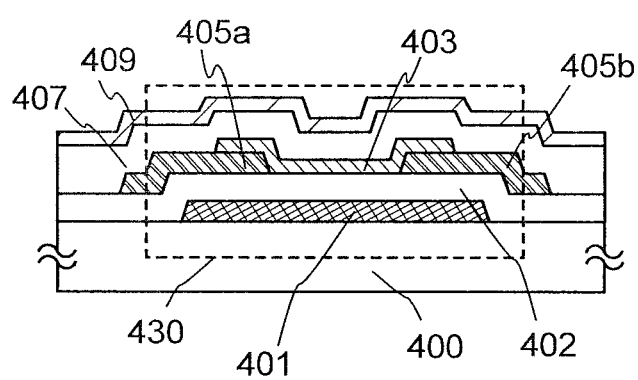

A transistor 430 illustrated in FIG. 10C is a bottom-gate transistor and includes, over the substrate 400 having an insulating surface, the gate electrode layer 401, the gate insulating layer 402, the source electrode layer 405*a*, the drain electrode layer 405*b*, and the oxide semiconductor layer 403. The insulating film 407 is provided to cover the transistor 430 and to be in contact with the oxide semiconductor layer 403. Further, the protective insulating layer 409 is formed over the insulating film 407.

In the transistor 430, the gate insulating layer 402 is provided over and in contact with the substrate 400 and the gate electrode layer 401; the source electrode layer 405*a* and the drain electrode layer 405*b* are provided over and in contact with the gate insulating layer 402. The oxide semiconductor layer 403 is provided over the gate insulating layer 402, the source electrode layer 405*a*, and the drain electrode layer 405*b*.

Figure 10D:
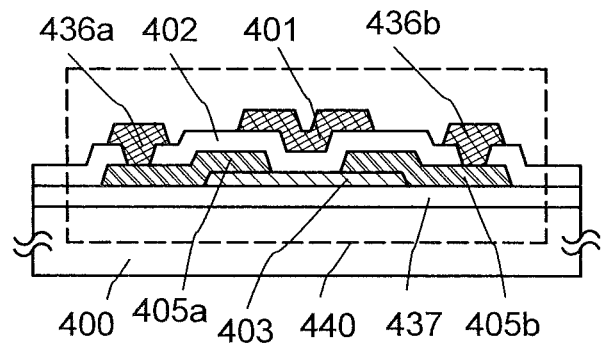

A transistor 440 illustrated in FIG. 10D is one of top-gate transistors. The transistor 440 includes, over the substrate 400 having an insulating surface, an insulating layer 437, the oxide semiconductor layer 403, the source electrode layer 405*a*, the drain electrode layer 405*b*, the gate insulating layer 402, and the gate electrode layer 401. A wiring layer 436*a* and a wiring layer 436*b* are provided in contact with and electrically connected to the source electrode layer 405*a* and the drain electrode layer 405*b* respectively.

In this embodiment, the oxide semiconductor layer 403 is used as a semiconductor layer as described above. As an oxide semiconductor used for the oxide semiconductor layer 403, the following metal oxides can be used: a four-component metal oxide such as an In—Sn—Ga—Zn—O-based oxide semiconductor; a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga-Zn—O-based oxide semiconductor, and a Sn—Al—Zn—O-based oxide semiconductor; a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O- based oxide semiconductor, and an In—Mg—O-based oxide semiconductor; an In—O-based oxide semiconductor; a Sn—O-based oxide semiconductor; a Zn—O-based oxide semiconductor; an In—Ga—O-based oxide semiconductor. In addition, $SiO_2$ may be contained in the above oxide semiconductor. Here, for example, an In—Ga—Zn—O-based oxide semiconductor means an oxide film containing indium (In), gallium (Ga), and zinc (Zn), and there is no particular limitation on the composition ratio thereof. The In—Ga—Zn—O-based oxide semiconductor may contain an element other than In, Ga, and Zn.

As the oxide semiconductor layer 403, a thin film represented by a chemical formula of $InMO_3(ZnO)_m$ (m>0) can be used. Here, M represents one or more metal elements selected from Zn, Ga, Al, Mn, and Co. For example, M can be Ga, Ga and Al, Ga and Mn, Ga and Co, or the like.

In each of the transistors 410, 420, 430, and 440 including the oxide semiconductor layer 403, the current value in an off state (off-state current value) can be reduced. Thus, in a pixel, a capacitor for holding an electric signal such as an image signal can be designed to be smaller. Accordingly, the aperture ratio of the pixel can be increased, so that power consumption can be suppressed.

In addition, each of the transistors 410, 420, 430, and 440 including the oxide semiconductor layer 403 can operate at high speed because relatively high field-effect mobility can be obtained. It has been found that color breaking is reduced by increase in frame frequency. Consequently, when the above transistors are used in a pixel portion of a liquid crystal display device, color breaking can be suppressed by increase in frame frequency and high-quality images can be obtained. In addition, since the above transistors can be provided in each of a driver circuit portion and a pixel portion over one substrate, the number of components of the liquid crystal display device can be reduced.

There is no limitation on a substrate that can be applied to the substrate 400 having an insulating surface; however, a glass substrate such as a glass substrate made of barium borosilicate glass or aluminosilicate glass is used.

In the bottom-gate transistors 410, 420, and 430, an insulating film serving as a base film may be provided between the substrate and the gate electrode layer. The base film has a function of preventing diffusion of an impurity element from the substrate, and can be formed to have a stacked-layer structure using one or more of a silicon nitride film, a silicon oxide film, a silicon nitride oxide film, and a silicon oxynitride film.

The gate electrode layer 401 can be formed to have a single-layer structure or a stacked-layer structure using any of a metal material such as molybdenum, titanium, chromium, tantalum, tungsten, aluminum, copper, neodymium, or scandium, or an alloy material which contains any of these materials as its main component.

The gate insulating layer 402 can be formed with a single-layer structure or a stacked structure using any of a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, and a hafnium oxide layer by a plasma CVD method, a sputtering method, or the like. For example, a silicon nitride layer ($SiN_y$ (y>0)) having a thickness of 50 nm to 200 nm inclusive is formed as a first gate insulating layer by a plasma CVD method, and a silicon oxide layer ($SiO_x$ (x>0)) having a thickness of 5 nm to 300 nm inclusive is formed as a second gate insulating layer over the first gate insulating layer, so that a gate insulating layer with a total thickness of 200 nm is formed.

As a conductive film used for the source electrode layer 405a and the drain electrode layer 405b, for example, a metal film containing an element selected from Al, Cr, Cu, Ta, Ti, Mo, and W and a metal nitride film containing the above elements as its main component (a titanium nitride film, a molybdenum nitride film, and a tungsten nitride film) can be used. A metal film having a high melting point of Ti, Mo, W, or the like or a metal nitride film of these elements (a titanium nitride film, a molybdenum nitride film, and a tungsten nitride film) may be stacked on one of or both of a lower side or an upper side of a metal film of Al, Cu, or the like.

A conductive film functioning as the wiring layer 436a and the wiring layer 436b connected to the source electrode layer 405a and the drain electrode layer 405b can be formed using a material similar to that of the source electrode layer 405a and the drain electrode layer 405b.

The conductive film to be the source electrode layer 405a and the drain electrode layer 405b (including a wiring layer formed using the same layer as the source electrode layer 405a and the drain electrode layer 405b) may be formed using conductive metal oxide. As the conductive metal oxide, indium oxide ($In_2O_3$), tin oxide ($SnO_2$), zinc oxide (ZnO), an alloy of indium oxide and tin oxide ($In_2O_3$—$SnO_2$, referred to as ITO), an alloy of indium oxide and zinc oxide ($In_2O_3$—ZnO), and such a metal oxide material containing silicon oxide can be used.

As the insulating films 407 and 427 provided over the oxide semiconductor layer, and the insulating film 437 provided under the oxide semiconductor layer, an inorganic insulating film such as a silicon oxide film, a silicon oxynitride film, an aluminum oxide film, an aluminum oxynitride film, or the like can be typically used.

For the protective insulating layer 409 provided over the oxide semiconductor layer, an inorganic insulating film such as a silicon nitride film, an aluminum nitride film, a silicon nitride oxide film, or an aluminum nitride oxide film can be used.

Further, a planarization insulating film may be formed over the protective insulating layer 409 so that surface roughness due to the transistor is reduced. As the planarization insulating film, an organic material such as polyimide, acrylic, and benzocyclobutene can be used. Besides the above organic materials, a low-dielectric constant material (a low-k material) or the like can be used. Note that the planarization insulating film may be formed by stacking a plurality of insulating films formed of these materials.

Figure 11:
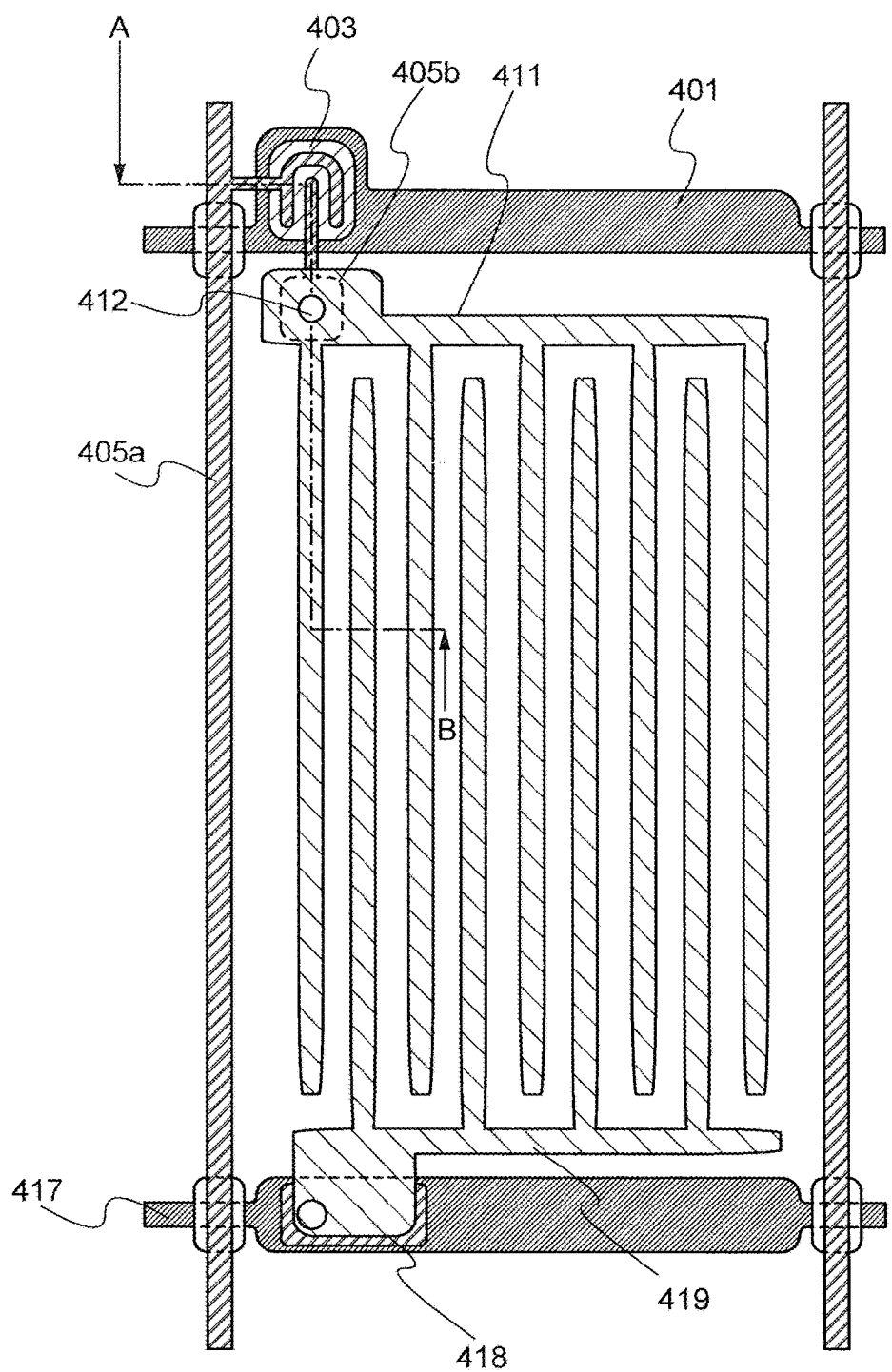
FIG. 11 is a top view of one embodiment of the present invention.
Figure 12:
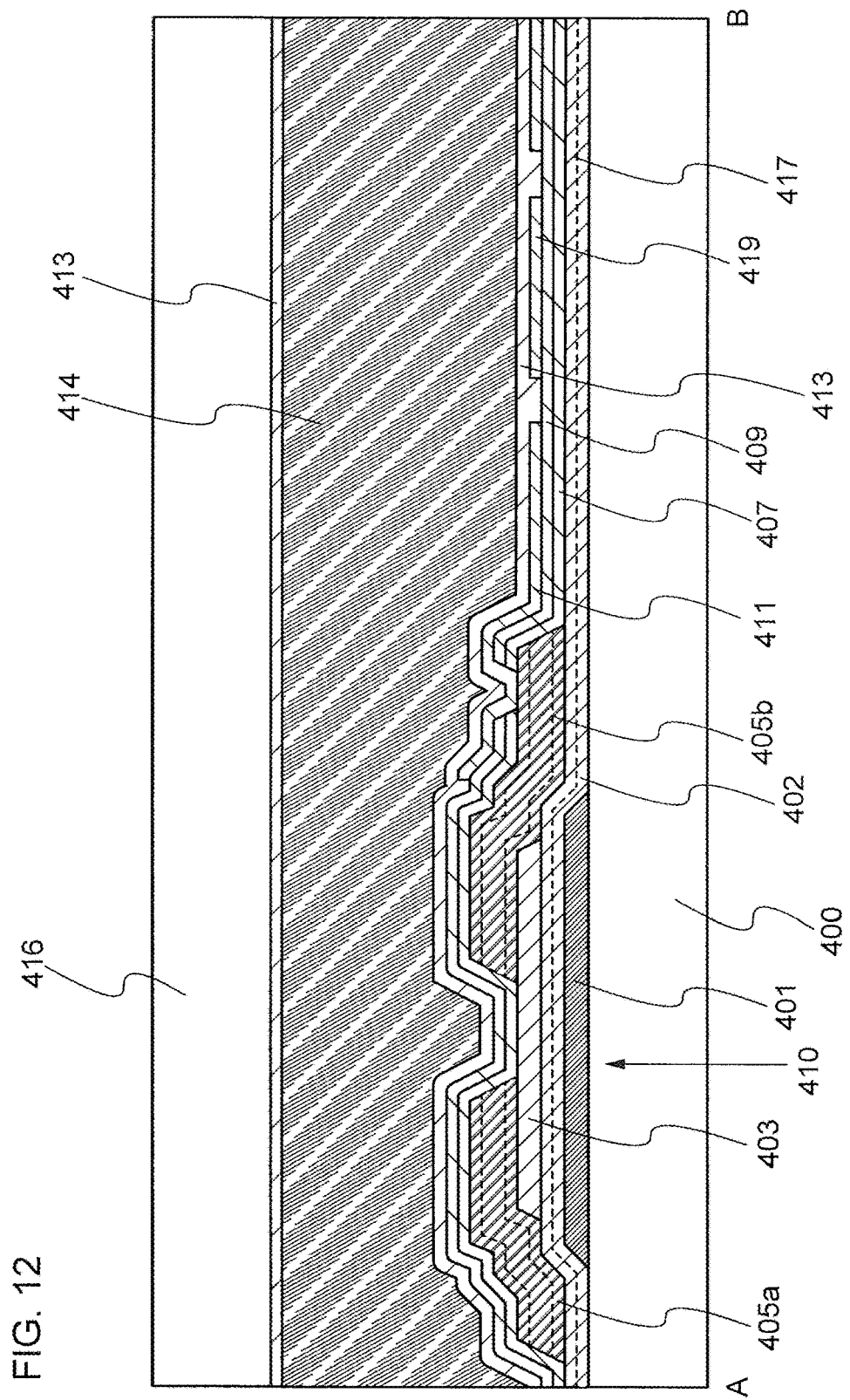
FIG. 12 is a cross-sectional view of one embodiment of the present invention.

An example of a pixel in a liquid crystal display device using such a transistor is illustrated in FIG. 11 and FIG. 12. FIG. 11 is a plan view of the pixel and FIG. 12 is a cross-sectional view taken along a line A-B shown in FIG. 11. Note that FIG. 11 illustrates a plan view of the substrate 400 over which the transistor 410 is formed, and FIG. 12 illustrates a structure in which a counter substrate 416 and a liquid crystal layer 414 are formed in addition to a structure of the substrate 400 over which a transistor 410 is formed. The following description will be given with reference to both FIG. 11 and FIG. 12.

The transistor 410 has the same structure as that of FIG. 10A, and includes the gate electrode layer 401, the gate insulating layer 402, and the oxide semiconductor layer 403. In a pixel, the gate electrode layer 401 is formed to extend in one direction. The oxide semiconductor layer 403 is provided to overlap with the gate electrode layer 401 with the gate insulating layer 402 interposed therebetween. The source electrode layer 405a and the drain electrode layer 405b are provided over the oxide semiconductor layer 403

(note that here, the terms "the source electrode layer 405a" and "the drain electrode layer 405b" are used just for convenience in order to distinguish electrodes in the transistor 410 between source and drain). The source electrode layer 405a is extended in a direction to intersect with the gate electrode layer 401. A first pixel electrode 411 is provided over the protective insulating layer 409, and the first pixel electrode 411 is connected to the drain electrode layer 405b through a contact hole 412. The first pixel electrode 411 is formed from a transparent electrode material such as indium tin oxide, zinc oxide, or tin oxide.

Further, a common wiring layer 417 and a common electrode layer 418 which are provided in the same layer as the gate electrode layer 401 are provided, and a second pixel electrode 419 is provided. Note that although not particularly illustrated in FIG. 11 and FIG. 12, a storage capacitor may be provided in the pixel as necessary.

The first pixel electrode 411 and the second pixel electrode 419 are formed to have a comb shape and can control alignment of liquid crystal in accordance with the electric field generated between the electrodes. Such a structure is applied to an IPS (in-plane switching) mode. The IPS mode is a mode of controlling alignment of liquid crystal molecules of a liquid crystal panel. The IPS mode is a mode in which an electrode is provided so as to be horizontal to the substrate and liquid crystal molecules are horizontal.

A counter electrode 415 is provided on the counter substrate 416 side. The liquid crystal layer 414 is provided between the substrate 400 and the counter substrate 416. An alignment film 413 is provided to be in contact with the liquid crystal layer 414. Alignment treatment for the alignment film 413 is made by an optical alignment method or a rubbing method. As a liquid crystal phase of the liquid crystal layer 414, a blue phase, or the like can be used.

The following components constitutes one unit: the transistor 410 in which the oxide semiconductor layer 403 is provided to overlap with the gate electrode layer 401 with the gate insulating layer 402 interposed therebetween; the first pixel electrode 411 which is connected to the source side or the drain side of the transistor 410 and drives liquid crystal; the second pixel electrode 419 provided to face the first pixel electrode 411; and the liquid crystal layer 414. A pixel can be constituted by the one or more of units, and the pixels are provided in matrix, whereby a display panel for displaying an image or the like can be formed.

Figure 13:
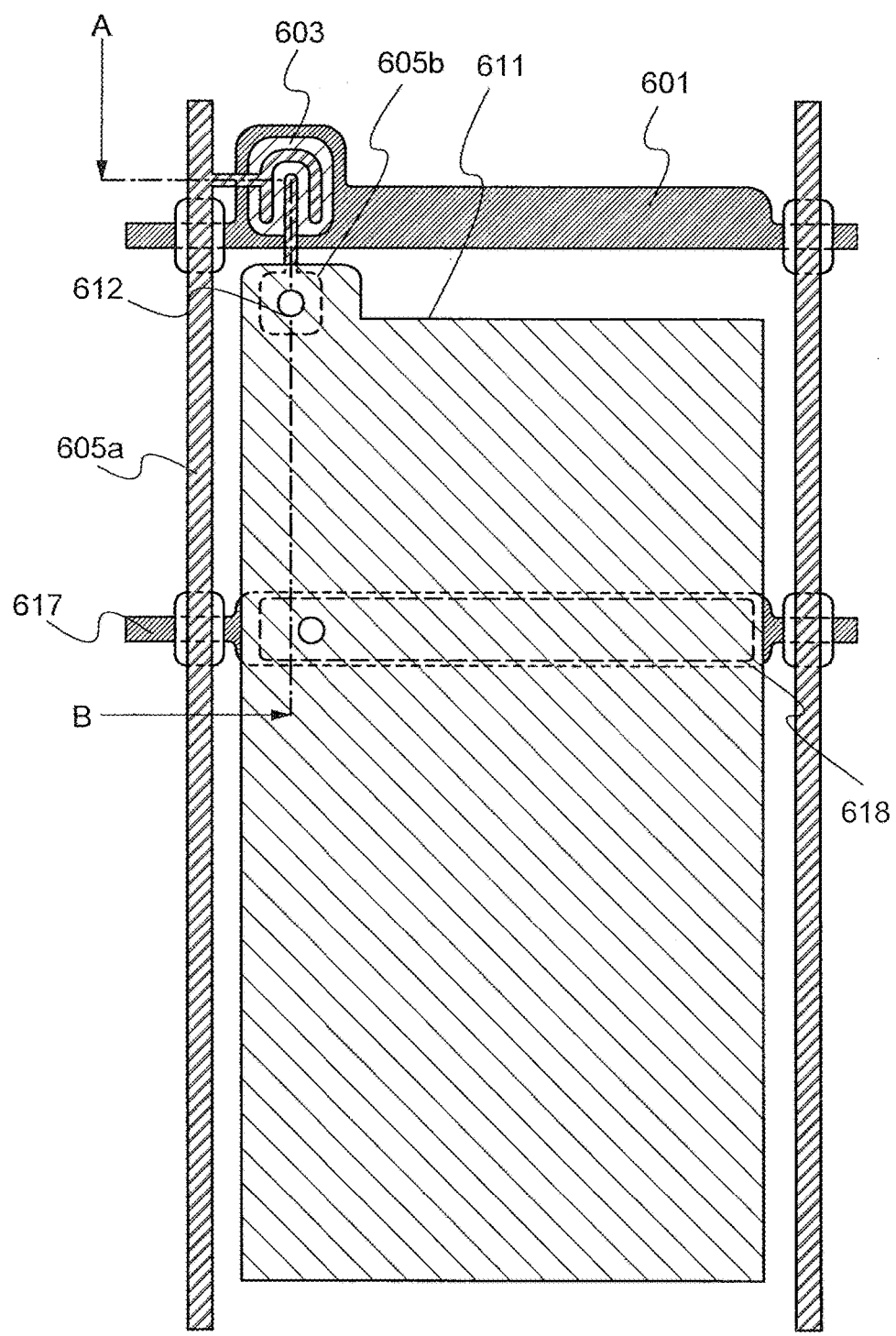
FIG. 13 is a top view of one embodiment of the present invention.
Figure 14:
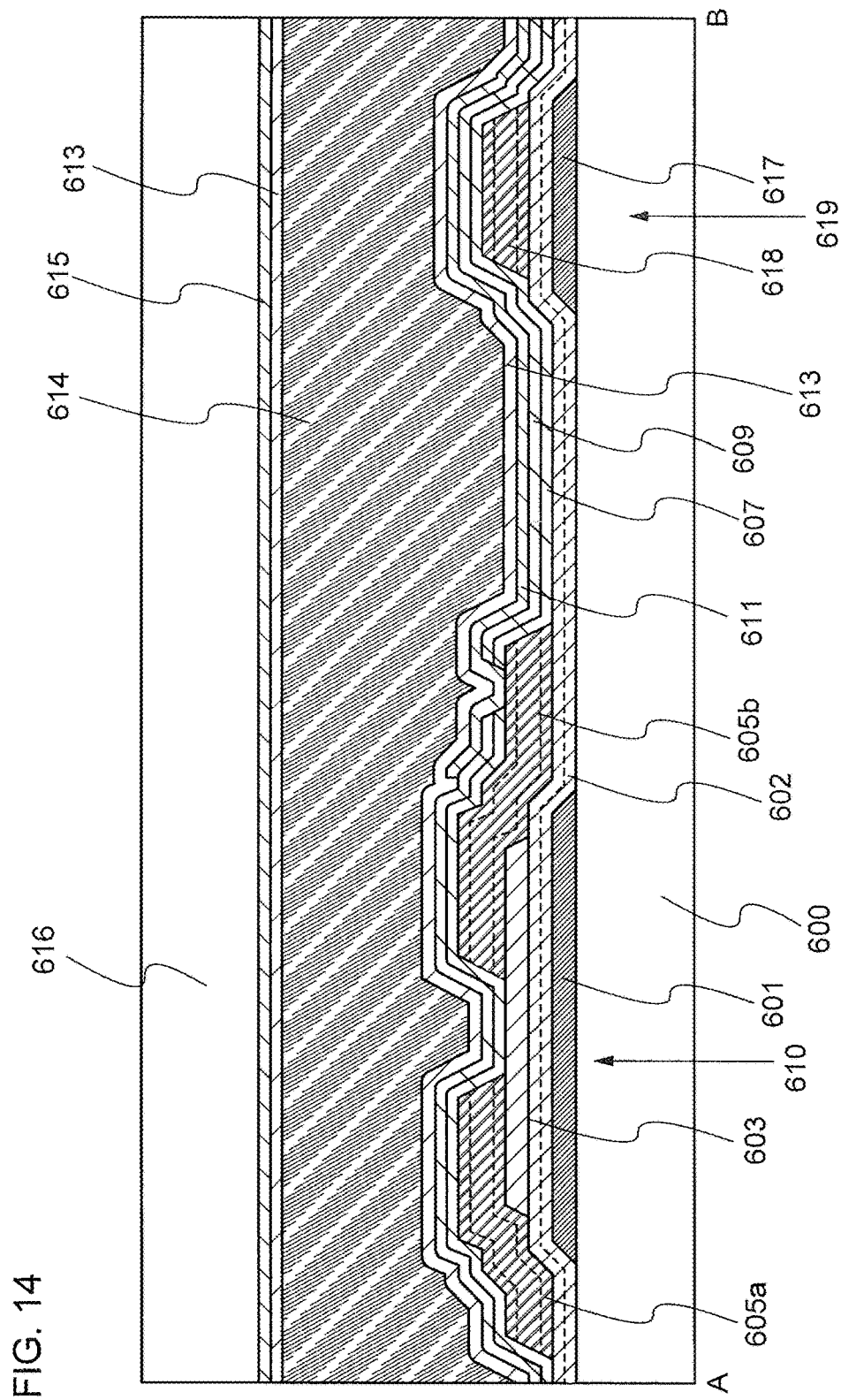
FIG. 14 is a cross-sectional view of one embodiment of the present invention.

Note that in addition to the IPS mode illustrated in FIG. 11 and FIG. 12, a TN (twisted nematic) mode in which a cell gap is small can be applied. An example of a pixel of a TN mode liquid crystal display device is illustrated in FIG. 13 and FIG. 14. FIG. 13 is a plan view of the pixel and FIG. 14 is a cross-sectional view taken along a line A-B shown in FIG. 13. Note that FIG. 13 illustrates a plan view of the substrate 400 over which the transistor 610 is formed, and FIG. 14 illustrates a structure in which a counter substrate 616 and a liquid crystal layer 614 are formed in addition to a structure of the substrate 600 over which a transistor 610 is formed. The following description will be given with reference to both FIG. 13 and FIG. 14.

The transistor 610 has the same structure as that of FIG. 10A, and includes the gate electrode layer 601, the gate insulating layer 602, and the oxide semiconductor layer 603. In a pixel, the gate electrode layer 601 is formed to extend in one direction. The oxide semiconductor layer 603 is provided to overlap with the gate electrode layer 601 with the gate insulating layer 602 interposed therebetween. The source electrode layer 605a and the drain electrode layer 605b are provided over the oxide semiconductor layer 603

(note that here, the terms "the source electrode layer 605a" and "the drain electrode layer 605b" are used just for convenience in order to distinguish electrodes in the transistor 610 between source and drain). The source electrode layer 605a is extended in a direction to intersect with the gate electrode layer 601. A pixel electrode 611 is provided over the protective insulating layer 609 which is farmed over an insulating film 607, and the pixel electrode 611 is connected to the drain electrode layer 605b through a contact hole 612. The pixel electrode 611 is formed from a transparent electrode material such as indium tin oxide, zinc oxide, or tin oxide.

A storage capacitor 619 may be provided as appropriate. When the storage capacitor 619 is provided, the storage capacitor 619 is formed including a capacitor wiring layer 617 formed in the same layer as the gate electrode layer 601, and a capacitor electrode layer 618. Between the capacitor wiring layer 617 and the capacitor electrode layers 618, the gate insulating layer 602 is extended to function as a dielectric, so that the storage capacitor 619 are formed.

The pixel electrode 611 can control the alignment of liquid crystal by facing a counter electrode 615 on the counter substrate 616 side. Such a structure is applied in the case of the TN (twisted nematic) mode. The TN mode is a mode of controlling alignment of liquid crystal molecules of a liquid crystal panel.

A counter electrode 615 is provided on the counter substrate 616 side. The liquid crystal layer 614 is provided between the substrate 600 and the counter substrate 616. An alignment film 613 is provided to be in contact with the liquid crystal layer 614. Alignment treatment for the alignment film 613 is made by an optical alignment method or a rubbing method. As a liquid crystal phase of the liquid crystal layer 616, a nematic phase, or the like can be used.

The following components constitutes one unit: the transistor 610 in which the oxide semiconductor layer 603 is provided to overlap with the gate electrode layer 601 with the gate insulating layer 602 interposed therebetween; the pixel electrode 611 which is connected to the source side or the drain side of the transistor 610 and drives liquid crystal; the counter electrode 615 provided to face the pixel electrode 611; and the liquid crystal layer 614 provided between the pixel electrode 611 and the counter electrode 615. A pixel can be constituted by the one or more of units, and the pixels are provided in matrix, whereby a display panel for displaying an image or the like can be formed.

In such a manner, by using a transistor including an oxide semiconductor layer having high field-effect mobility and low off-state current in this embodiment, a liquid crystal display device with low power consumption can be provided.

This embodiment can be implemented by combination with structures described in the other embodiments as appropriate.

[Embodiment 4]

In this embodiment, examples of a transistor including an oxide semiconductor layer and a manufacturing method thereof will be described in detail below with reference to FIGS. 15A to 15E. The same portion as or a portion having a function similar to those in the above embodiments, and repetitive description is omitted. In addition, detailed description of the same portions is not repeated.

FIGS. 15A to 15E illustrate an example of a cross-sectional structure of a transistor. A transistor 510 illustrated in FIGS. 15A to 15E is an inverted staggered thin film transistor having a bottom gate structure, which is similar to the transistor 410 illustrated in FIG. 10A.

Hereinafter, a manufacturing process of the transistor 510 over a substrate 505 is described with reference to FIGS. 15A to 15E.

First, a conductive film is formed over the substrate 505 having an insulating surface, and then, a gate electrode layer 511 is formed through a first photolithography step. Note that a resist mask may be formed by an inkjet method. Formation of the resist mask by an inkjet method needs no photomask; thus, manufacturing cost can be reduced.

As the substrate 505 having an insulating surface, a substrate similar to the substrate 400 described in Embodiment 4 can be used. In this embodiment, a glass substrate is used as the substrate 505.

An insulating film serving as a base film may be provided between the substrate 505 and the gate electrode layer 511. The base film has a function of preventing diffusion of an impurity element from the substrate 505, and can be formed with a single-layer structure or a stacked-layer structure using one or more of a silicon nitride film, a silicon oxide film, a silicon nitride oxide film, and a silicon oxynitride film.

The gate electrode layer 511 can be formed to have a single-layer structure or a stacked-layer structure using any of a metal material such as molybdenum, titanium, tantalum, tungsten, aluminum, copper, neodymium, or scandium, and an alloy material which includes any of these as a main component.

Next, a gate insulating layer 507 is formed over the gate electrode layer 511. The gate insulating layer 507 can be formed by a plasma CVD method, a sputtering method, or the like to have a single layer structure or a stacked-layer structure using any of a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, and a hafnium oxide layer.

For the oxide semiconductor in this embodiment, an oxide semiconductor which is made to be an i-type semiconductor or a substantially i-type semiconductor by removing an impurity is used. Such a highly purified oxide semiconductor is highly sensitive to an interface state and interface charges; thus, an interface between the oxide semiconductor layer and the gate insulating layer is important. For that reason, the gate insulating layer that is to be in contact with a highly purified oxide semiconductor needs to have high quality.

For example, high-density plasma CVD using microwaves (e.g., with a frequency of 2.45 GHz) is preferably adopted because an insulating layer can be dense and have high withstand voltage and high quality. The highly purified oxide semiconductor and the high-quality gate insulating layer are in close contact with each other, whereby the interface state density can be reduced to obtain favorable interface characteristics.

Needless to say, another formation method such as a sputtering method or a plasma CVD method can be employed as long as the method enables formation of a high-quality insulating layer as a gate insulating layer. Further, an insulating layer whose film quality and characteristics of the interface between the insulating layer and an oxide semiconductor are improved by heat treatment which is performed after formation of the insulating layer may be formed as a gate insulating layer. In any case, any insulating layer may be used as long as the insulating layer has characteristics of enabling a reduction in interface state density of the interface between the insulating layer and an oxide semiconductor and formation of a favorable interface as well as having favorable film quality as a gate insulating layer.

In order to contain hydrogen, a hydroxyl group, and moisture in the gate insulating layer 507 and an oxide semiconductor film 530 as little as possible, it is preferable to perform pretreatment for formation of the oxide semiconductor film 530. As the pretreatment, the substrate 505 provided with the gate electrode layer 511 or a substrate 505 over which the gate electrode layer 511 and the gate insulating layer 507 are formed is preheated in a preheating chamber of a sputtering apparatus, whereby an impurity such as hydrogen or moisture adsorbed on the substrate 505 is removed and then, evacuation is performed. As an evacuation unit provided in the preheating chamber, a cryopump is preferable. Note that this preheating treatment can be omitted. Further, the above preheating may be performed in a similar manner, on the substrate 505 in a state where a source electrode layer 515*a* and a drain electrode layer 515*b* have been formed thereover but an insulating layer 516 has not been formed yet.

Figure 15A:
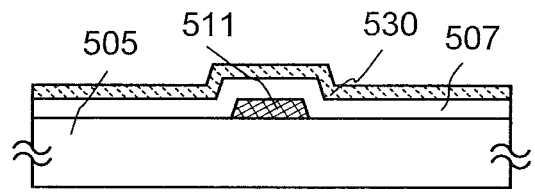
FIGS. 15A to 15E are cross-sectional views of one embodiment of the present invention.
Figure 15B:
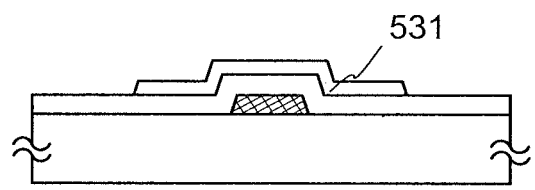
Figure 15C:
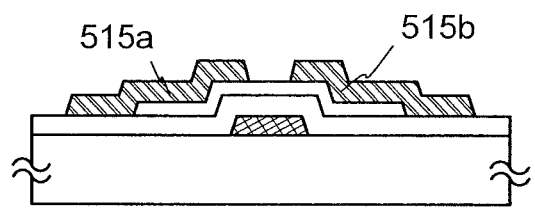

Next, over the gate insulating layer 507, the oxide semiconductor film 530 having a thickness greater than or equal to 2 nm and less than or equal to 200 nm, preferably greater than or equal to 5 nm and less than or equal to 30 nm is formed (see FIG. 15A).

Note that before the oxide semiconductor film 530 is formed by a sputtering method, powder substances (also referred to as particles or dust) which attach on a surface of the gate insulating layer 507 are preferably removed by reverse sputtering in which an argon gas is introduced and plasma is generated. The reverse sputtering refers to a method in which, without applying a voltage to a target side, an RF power source is used for application of a voltage to a substrate side in an argon atmosphere to generate plasma in the vicinity of the substrate to modify a surface. Note that instead of an argon atmosphere, a nitrogen atmosphere, a helium atmosphere, an oxygen atmosphere, or the like may be used.

As an oxide semiconductor for the oxide semiconductor film 530, the oxide semiconductor described in Embodiment 3 can be used. Further, $SiO_2$ may be contained in the above oxide semiconductor. In this embodiment, the oxide semiconductor film 530 is deposited by a sputtering method with the use of an In—Ga—Zn—O-based oxide target. A cross-sectional view at this stage is illustrated in FIG. 15A. Alternatively, the oxide semiconductor film 530 can be formed by a sputtering method in a rare gas (typically argon) atmosphere, an oxygen atmosphere, or a mixed atmosphere containing a rare gas (typically argon) and oxygen.

The target used for formation of the oxide semiconductor film 530 by a sputtering method is, for example, an oxide target containing $In_2O_3$, $Ga_2O_3$, and ZnO at a composition ratio of 1:1:1[molar ratio], so that an In—Ga—Zn—O film is formed. Without limitation to the material and the component of the target, for example, an oxide target containing $In_2O_3$, $Ga_2O_3$, and ZnO at 1:1:2 [molar ratio] may be used.

The filling factor of the oxide target is greater than or equal to 90% and less than or equal to 100%, preferably greater than or equal to 95% and less than or equal to 99.9%. With use of the metal oxide target with high filling factor, a dense oxide semiconductor film can be formed.

It is preferable that a high-purity gas from which an impurity such as hydrogen, water, a hydroxyl group, or a hydride has been removed be used as a sputtering gas used for forming the oxide semiconductor film 530.

The substrate is held in a deposition chamber kept under reduced pressure, and the substrate temperature is set to 100° C. to 600° C. inclusive, preferably 200° C. to 400° C. inclusive. Formation of the oxide semiconductor film is conducted with heating the substrate, whereby the concentration of impurities included in the formed oxide semiconductor film can be reduced. In addition, damage by sputtering can be reduced. Then, a sputtering gas from which hydrogen and moisture are removed is introduced into the deposition chamber where remaining moisture is being removed, and the oxide semiconductor film 530 is deposited with use of the above target, over the substrate 505. In order to remove remaining moisture from the deposition chamber, an adsorption-type vacuum pump such as a cryopump, an ion pump, or a titanium sublimation pump is preferably used. The evacuation unit may be a turbo pump provided with a cold trap. In the deposition chamber which is evacuated with use of the cryopump, a hydrogen atom, a compound including a hydrogen atom, such as water ($H_2O$), (more preferably, also a compound including a carbon atom), and the like are removed, whereby the concentration of impurities in the oxide semiconductor film formed in the deposition chamber can be reduced.

As one example of the deposition condition, the distance between the substrate and the target is 100 mm, the pressure is 0.6 Pa, the direct-current (DC) power source is 0.5 kW, and the atmosphere is an oxygen atmosphere (the proportion of the oxygen flow rate is 100%). Note that use of a pulse direct current power source is preferable because powder substances (also referred to as particles or dust) generated in film formation can be reduced and the film thickness can be uniform.

Then, through a second photolithography step, the oxide semiconductor film 530 is processed into an island-shaped oxide semiconductor layer. A resist mask for forming the island-shaped oxide semiconductor layer may be formed by an ink-jet method. Formation of the resist mask by an inkjet method needs no photomask; thus, manufacturing cost can be reduced.

In the case where a contact hole is formed in the gate insulating layer 507, a step of forming the contact hole can be performed at the same time as processing of the oxide semiconductor film 530.

Note that the etching of the oxide semiconductor film 530 may be dry etching, wet etching, or both dry etching and wet etching. As an etchant used for wet etching of the oxide semiconductor film 530, for example, a mixed solution of phosphoric acid, acetic acid, and nitric acid, or the like can be used. In addition, ITO07N (produced by KANTO CHEMICAL CO., INC.) may be used.

Next, the oxide semiconductor layer is subjected to first heat treatment. By this first heat treatment, the oxide semiconductor layer can be dehydrated or dehydrogenated. The temperature of the first heat treatment is higher than or equal to 400° C. and lower than or equal to 750° C., preferably higher than or equal to 400° C. and lower than the strain point of the substrate. Here, the substrate is introduced into an electric furnace which is one of heat treatment apparatuses, heat treatment is performed on the oxide semiconductor layer in a nitrogen atmosphere at 450° C. for one hour, and then, the oxide semiconductor layer is not exposed to the air so that entry of water and hydrogen into the oxide semiconductor layer is prevented; thus, an oxide semiconductor layer 531 is obtained (see FIG. 15B).

Further, a heat treatment apparatus used in this step is not limited to an electric furnace, and a device for heating an object to be processed by heat conduction or heat radiation from a heating element such as a resistance heating element may be alternatively used. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high temperature gas, an inert gas which does not react with an object to be processed by heat treatment, such as nitrogen or a rare gas like argon, is used.

For example, as the first heat treatment, GRTA may be performed as follows: the substrate is transferred and put into an inert gas heated to a high temperature as high as 650° C. to 700° C., heated for several minutes, and taken out from the inert gas heated to the high temperature.

Note that in the first heat treatment, it is preferable that water, hydrogen, and the like be not contained in the atmosphere of nitrogen or a rare gas such as helium, neon, or argon. The purity of nitrogen or the rare gas such as helium, neon, or argon which is introduced into the heat treatment apparatus is preferably set to be 6 N (99.9999%) or higher, far preferably 7 N (99.99999%) or higher (that is, the impurity concentration is preferably 1 ppm or lower, far preferably 0.1 ppm or lower).

After the oxide semiconductor layer is heated by the first heat treatment, a high-purity oxygen gas, a high-purity $N_2O$ gas, or ultra-dry air (having a dew point of −40° C. or lower, preferably −60° C. or lower) may be introduced into the same furnace. It is preferable that water, hydrogen, or the like be not contained in the oxygen gas or the $N_2O$ gas. Alternatively, the purity of an oxygen gas or an $N_2O$ gas which is introduced into the heat treatment apparatus is preferably 6 N or more, further preferably 7 N or more (i.e., the impurity concentration of the oxygen gas or the $N_2O$ gas is 1 ppm or lower, preferably 0.1 ppm or lower). Although oxygen which is a main component included in the oxide semiconductor has been reduced through the elimination of impurities by performance of dehydration treatment or dehydrogenation treatment, oxygen is supplied by the effect of introduction of the oxygen gas or the $N_2O$ gas in the above manner, so that the oxide semiconductor layer is highly purified and made to be an electrically i-type (intrinsic) semiconductor.

Alternatively, the first heat treatment of the oxide semiconductor layer can be performed on the oxide semiconductor film 530 which has not yet been processed into the island-shaped oxide semiconductor layer. In that case, the substrate is taken out from the heat apparatus after the first heat treatment, and then a photolithography step is performed.

Note that other than the above timing, the first heat treatment may be performed at any of the following timings as long as it is after the oxide semiconductor layer is formed. For example, the timing may be after a source electrode layer and a drain electrode layer are formed over the oxide semiconductor layer or after an insulating layer is formed over the source electrode layer and the drain electrode layer.

Further, in the case where a contact hole is formed in the gate insulating layer 507, the formation of the contact hole may be performed before or after the first heat treatment is performed on the oxide semiconductor film 530.

Alternatively, an oxide semiconductor layer may be formed through two deposition steps and two heat treatment steps. The thus formed oxide semiconductor layer has a thick crystalline region (single crystalline region), that is, a crystalline region the c-axis of which is aligned in a direction perpendicular to a surface of the layer, even when a base component includes any of an oxide, a nitride, a metal, or the like. For example, a first oxide semiconductor film with a thickness greater than or equal to 3 nm and less than or equal to 15 nm is deposited, and first heat treatment is performed in a nitrogen, oxygen, rare gas, or dry air atmosphere at 450° C. to 850° C. inclusive, preferably 550° C. to 750° C. inclusive, so that the first oxide semiconductor film has a crystalline region (including a plate-like crystal) in a region including its surface. Then, a second oxide semiconductor film which has a larger thickness than the first oxide semiconductor film is formed, and second heat treatment is performed at 450° C. to 850° C. inclusive or preferably 600° C. to 700° C. inclusive, so that crystal growth proceeds upward with use of the first oxide semiconductor film as a seed of the crystal growth and the whole second oxide semiconductor film is crystallized. In such a manner, the oxide semiconductor layer having a thick crystalline region may be obtained.

Next, a conductive film to be the source and drain electrode layers (including a wiring formed in the same layer as the source and drain electrode layers) is formed over the gate insulating layer 507 and the oxide semiconductor layer 531. The conductive film to be the source and drain electrode layers can be formed using the material which is used for the source electrode layer 405a and the drain electrode layer 405b described in Embodiment 3.

By performance of a third photolithography step, a resist mask is formed over the conductive film, and selective etching is performed, so that the source electrode layer 515a and the drain electrode layer 515b are formed. Then, the resist mask is removed (see FIG. 15C).

Light exposure at the time of the formation of the resist mask in the third photolithography step may be performed using ultraviolet light, KrF laser light, or ArF laser light. A channel length L of the transistor formed later is determined by the distance between the lower edge portion of the source electrode layer and the lower edge portion of the drain electrode layer which are next to each other over the oxide semiconductor layer 531. In the case where a channel length L is less than 25 nm, light exposure for formation of the resist mask in the third photolithography step may be performed using extreme ultraviolet light having an extremely short wavelength of several nanometers to several tens of nanometers. In the light exposure by extreme ultraviolet light, the resolution is high and the focus depth is large. For these reasons, the channel length L of the transistor to be formed later can be in the range of 10 nm to 1000 nm inclusive, and the circuit can operate at higher speed.

In order to reduce the number of photomasks used in a photolithography step and reduce the number of steps, an etching step may be performed with the use of a multi-tone mask which is a light-exposure mask through which light is transmitted to have a plurality of intensities. A resist mask formed with use of a multi-tone mask has a plurality of thicknesses and further can be changed in shape by etching; therefore, the resist mask can be used in a plurality of etching steps for processing into different patterns. Therefore, a resist mask corresponding to at least two or more kinds of different patterns can be formed with one multi-tone mask. Thus, the number of light-exposure masks can be reduced and the number of corresponding photolithography steps can be also reduced, whereby simplification of a process can be realized.

Note that when the conductive film is etched, the optimum etching condition is desirably made so that the oxide semiconductor layer 531 can be prevented to be etched together with the conductive film and divided. However, it is difficult to attain such a condition that only the conductive film is etched and the oxide semiconductor layer 531 is not etched at all. In etching of the conductive film, the oxide semiconductor layer 531 is partly etched in some cases, whereby the oxide semiconductor layer having a groove portion (a depressed portion) is formed.

In this embodiment, since a titanium (Ti) film is used as the conductive film and the In—Ga—Zn—O-based oxide semiconductor is used for the oxide semiconductor layer 531, an ammonium hydrogen peroxide mixture (a mixed solution of ammonia, water, and hydrogen peroxide) is used as an etchant.

Next, by plasma treatment using a gas such as $N_2O$, $N_2$, or Ar, water or the like adsorbed to a surface of an exposed portion of the oxide semiconductor layer may be removed. In the case where the plasma treatment is performed, the insulating layer 516 which serves as a protective insulating film in contact with part of the oxide semiconductor layer is formed without exposure to the air.

The insulating layer 516 can be formed to a thickness of at least 1 nm by a method by which an impurity such as water or hydrogen does not enter the insulating layer 516, such as a sputtering method as appropriate. When hydrogen is contained in the insulating layer 516, the hydrogen enters the oxide semiconductor layer or extracts oxygen from the oxide semiconductor layer, which causes a reduction in resistance of a back channel of the oxide semiconductor layer (i.e., makes an n-type back channel), so that a parasitic channel might be formed. Therefore, it is important for the insulating layer 516 that hydrogen is not used in a formation method in order to contain hydrogen as little as possible.

In this embodiment, a silicon oxide film is formed to a thickness of 200 nm as the insulating layer 516 by a sputtering method. The substrate temperature in film formation may be higher than or equal to room temperature and lower than or equal to 300° C. and in this embodiment, is 100° C. The silicon oxide film can be formed by a sputtering method in a rare gas (typically argon) atmosphere, an oxygen atmosphere, or a mixed atmosphere containing a rare gas and oxygen. As a target, a silicon oxide target or a silicon target may be used. For example, the silicon oxide film can be formed using a silicon target by a sputtering method in an atmosphere containing oxygen. As the insulating layer 516 which is formed in contact with the oxide semiconductor layer, an inorganic insulating film which does not include an impurity such as moisture, a hydrogen ion, or OH⁻ and blocks the entry of the impurity from the outside is used. Typically, a silicon oxide film, a silicon oxynitride film, an aluminum oxide film, an aluminum oxynitride film, or the like is used.

As in the case of formation of the oxide semiconductor film 530, an adsorption-type vacuum pump (such as a cryopump) is preferably used in order to remove remaining moisture in a deposition chamber of the insulating layer 516. When the insulating layer 516 is deposited in the deposition chamber which is evacuated with use of a cryopump, the concentration of an impurity contained in the insulating layer 516 can be reduced. Alternatively, the evacuation unit used for removal of the remaining moisture in the deposition chamber may be a turbo pump provided with a cold trap.

It is preferable that a high-purity gas from which impurities such as hydrogen, water, a hydroxyl group, or a hydride have been removed be used as a sputtering gas used for forming the insulating layer 516.

Next, second heat treatment is performed in an inert gas atmosphere or an oxygen gas atmosphere (preferably at from 200° C. to 400° C., e.g. 250° C. to 350° C. inclusive). For example, the second heat treatment is performed in a nitrogen atmosphere at 250° C. for one hour. The second heat treatment is performed in such a condition that part (a channel formation region) of the oxide semiconductor layer is in contact with the insulating layer 516.

As described above, an impurity such as hydrogen, moisture, a hydroxyl group, or a hydride (also referred to as a hydrogen compound) is intentionally removed from the oxide semiconductor film by subjecting the oxide semiconductor layer to the first heat treatment, and then oxygen which is one of main components of the oxide semiconductor can be supplied by the second heat treatment and has been reduced in the step of removing impurities. Through the above steps, the oxide semiconductor layer is highly purified and is made to be an electrically i-type (intrinsic) semiconductor. Note that the hydrogen concentration in the highly-purified oxide semiconductor layer 304*a* and the second oxide semiconductor layer 306*a* is $5\times10^{19}$ atoms/$cm^3$ or less, preferably $5\times10^{18}$ atoms/$cm^3$ or less, more preferably $5\times10^{17}$ atoms/$cm^3$ or less. Note that the above hydrogen concentration of the oxide semiconductor film is measured by secondary ion mass spectrometry (SIMS).

Figure 15D:
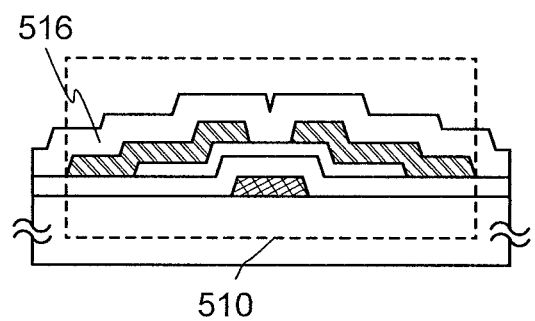
Figure 15E:
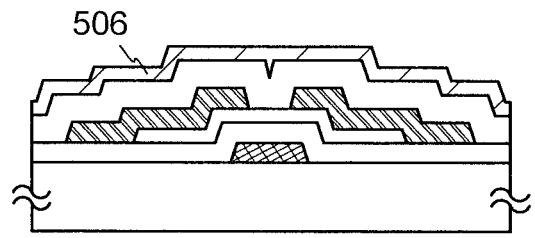

Through the above process, the transistor 510 is formed (see FIG. 15D).

When a silicon oxide layer having a lot of defects is used as the insulating layer 516, an impurity such as hydrogen, moisture, a hydroxyl group, or a hydride contained in the oxide semiconductor layer can be diffused into the insulating layer 516 by the heat treatment which is performed after the formation of the silicon oxide layer, so that impurities in the oxide semiconductor layer can be further reduced.

A protective insulating layer 506 may be formed over the insulating layer 516. For example, a silicon nitride film is formed by an RF sputtering method. Since an RF sputtering method has high productivity, it is a preferable method used for formation of the protective insulating layer. As the protective insulating layer, an inorganic insulating film which does not include an impurity such as moisture and blocks entry of the impurity from the outside, e.g., a silicon nitride film, an aluminum nitride film, or the like is used. In this embodiment, the protective insulating layer 506 is formed using a silicon nitride film (see FIG. 15E).

In this embodiment, as the protective insulating layer 506, a silicon nitride film is formed by heating the substrate 505 over which the steps up to and including the formation step of the insulating layer 516 have been done, to a temperature of 100° C. to 400° C., introducing a sputtering gas including high-purity nitrogen from which hydrogen and moisture are removed, and using a silicon semiconductor target. In that case also, it is preferable that remaining moisture be removed from a deposition chamber in the formation of the protective insulating layer 506 as in the case of the insulating layer 516.

After the formation of the protective insulating layer, heat treatment may be further performed at a temperature from 100° C. to 200° C. inclusive in the air for 1 hour to 30 hours inclusive. This heat treatment may be performed at a fixed heating temperature. Alternatively, the following change in the heating temperature may be conducted plural times repeatedly: the heating temperature is increased from room temperature to a temperature of 100° C. to 200° C. inclusive and then decreased to room temperature.

A transistor including an oxide semiconductor layer which is manufactured in accordance with this embodiment as described achieves high filed-effect mobility and thus can operate at high speed. It is found that color breaking is reduced by increase in frame frequency. When the transistor is used in a pixel portion in the liquid crystal display device, color breaking can be suppressed by increase in frame frequency and a high-quality image can be provided. In addition, a highly purified oxide semiconductor layer can be formed without processes such as laser irradiation, and enable a transistor to be formed over a large substrate, which is preferable.

This embodiment can be implemented by combination with structures described in the other embodiments as appropriate.

[Embodiment 5]

A liquid crystal display device disclosed in this specification can be applied to a variety of electronic appliances (including game machines). Examples of electronic appliances are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like. Examples of electronic devices each including the liquid crystal display device described in the above embodiment are described.

Figure 16A:
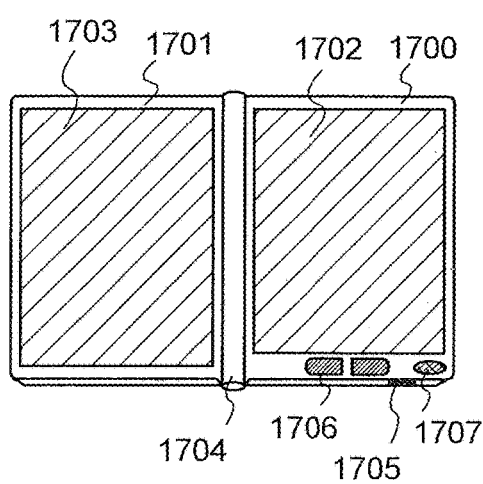
FIGS. 16A to 16D are diagrams each illustrating an electronic device of one embodiment of the present invention.

FIG. 16A illustrates an example of the electronic book devices. The electronic book reader illustrated in FIG. 16A includes two housings, a housing 1700 and a housing 1701. The housing 1700 and the housing 1701 are combined with a hinge 1704 so that the electronic book reader can be opened and closed. With such a structure, the e-book reader can be operated like a paper book.

A display portion 1702 and a display portion 1703 are incorporated in the housing 1700 and the housing 1701, respectively. The display portion 1702 and the display portion 1703 may be configured to display one image or different images. In the case where the display portion 1702 and the display portion 1703 display different images, for example, a display portion on the right side (the display portion 1702 in FIG. 16A) can display text and a display portion on the left side (the display portion 1703 in FIG. 16A) can display graphics.

Further, FIG. 16A illustrates an example in which the housing 1700 is provided with an operation portion and the like. For example, the housing 1700 is provided with a power supply input terminal 1705, an operation key 1706, a speaker 1707, and the like. With the operation key 1706, pages can be turned. Note that a keyboard, a pointing device, or the like may be provided on the surface of the housing, on which the display portion is provided. Further, an external connection terminal (an earphone terminal, a USB terminal, a terminal that can be connected to various cables such as a USB cable, or the like), a recording medium insert portion, or the like may be provided on the back surface or the side surface of the housing. Further, a function of an electronic dictionary may be provided for the electronic book reader illustrated in FIG. 16A.

Figure 16B:
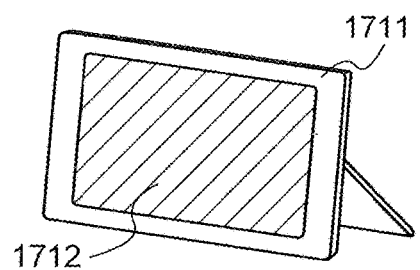

FIG. 16B illustrates an example of a digital photo frame including a liquid crystal display device. For example, in the digital photo frame illustrated in FIG. 16B, a display portion 1712 is incorporated in a housing 1711. The display portion 1712 can display various images. For example, the display portion 1712 can display data of an image taken with a digital camera or the like and function as a normal photo frame.

Note that the digital photo frame illustrated in FIG. 16B is provided with an operation portion, an external connection terminal (a USB terminal, a terminal which can be connected to a variety of cables such as a USB cable, and the like), a recording medium insertion portion, and the like. Although these components may be provided on the surface on which the display portion is provided, it is preferable to provide them on the side surface or the back surface for the design of the digital photo frame 9700. For example, a memory storing data of an image taken with a digital camera is inserted in the recording medium insertion portion of the digital photo frame, whereby the image data can be transferred and then displayed on the display portion 1712.

Figure 16C:
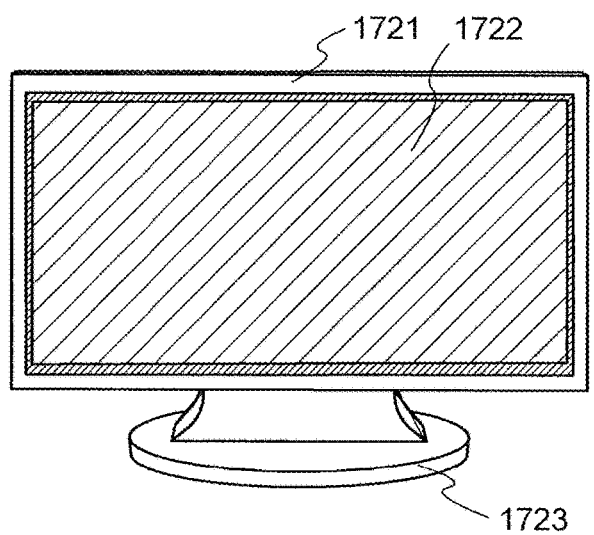

FIG. 16C illustrates an example of a television set in which a display device such as a liquid crystal display device or a light-emitting display device is used. In the television set illustrated in FIG. 16C, a display portion 1722 is incorporated in a housing 1721. The display portion 1722 can display an image. Further, the housing 1721 is supported by a stand 1723 here. The liquid crystal display device described in any of the above embodiments can be used in the display portion 1722.

The television set illustrated in FIG. 16C can be operated with an operation switch of the housing 1721 or a separate remote controller. Channels and volume can be controlled by operation keys of the remote controller, so that images displayed on the display portion 1722 can be controlled. Further, the remote controller may be provided with a display portion for displaying data output from the remote controller.

Figure 16D:
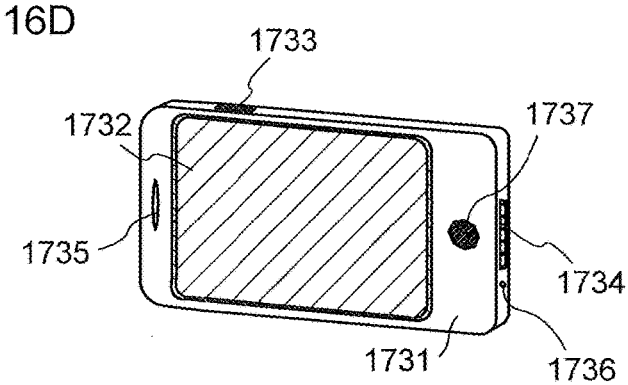

FIG. 16D illustrates an example of a mobile phone including a liquid crystal display device. The mobile phone handset illustrated in FIG. 16D is provided with a display portion 1732 incorporated in a housing 1731, an operation button 1733, an operation button 1737, an external connection port 1734, a speaker 1735, a microphone 1736, and the like.

The display portion 1732 of the mobile phone handset illustrated in FIG. 16D is a touch panel. By touching the display portion 1732 with a finger or the like, contents displayed on the display portion 1732 can be controlled. Further, operations such as making calls and texting can be performed by touching the display portion 1732 with a finger or the like.

This embodiment can be implemented by combination with structures described in the other embodiments as appropriate.

This application is based on Japanese Patent Application serial No. 2010-080794 filed with Japan Patent Office on Mar. 31, 2010, the entire contents of which are hereby incorporated by reference.

The invention claimed is:

1. A method for manufacturing a display device including a pixel,
   wherein the pixel includes a display element and a transistor for controlling the display element,
   wherein a channel formation region of the transistor includes an oxide semiconductor layer, and
   wherein the oxide semiconductor layer is formed via a step of reducing hydrogen and a step of supplying oxygen therein.

2. The method for manufacturing the display device according to claim 1, wherein a hydrogen concentration of the oxide semiconductor layer is $5 \times 10^{17}$ atoms/cm$^3$ or less.

3. The method for manufacturing the display device according to claim 1, wherein the step of reducing hydrogen and the step of supplying oxygen are performed by heat treatments.

4. A method for manufacturing a display device including a pixel,
   wherein the pixel includes a display element and a transistor for controlling the display element,
   wherein a channel formation region of the transistor includes an oxide semiconductor layer,
   the oxide semiconductor layer is formed via a step of reducing hydrogen and a step of supplying oxygen therein, and
   wherein the oxide semiconductor layer is intrinsic.

5. The method for manufacturing the display device according to claim 4, wherein a hydrogen concentration of the oxide semiconductor layer is $5 \times 10^{17}$ atoms/cm$^3$ or less.

6. The method for manufacturing the display device according to claim 4, wherein the step of reducing hydrogen and the step of supplying oxygen are performed by heat treatments.

* * * * *